(12) United States Patent
Zhao et al.

(10) Patent No.: US 12,105,169 B2
(45) Date of Patent: Oct. 1, 2024

(54) HIGH-DIMENSIONAL FAST CONVOLUTIONAL FRAMEWORK (HICU) FOR CALIBRATIONLESS MRI

(71) Applicant: Ohio State Innovation Foundation, Columbus, OH (US)

(72) Inventors: Shen Zhao, Columbus, OH (US); Rizwan Ahmad, Columbus, OH (US); Lee Potter, Riverlea, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 392 days.

(21) Appl. No.: 17/535,250

(22) Filed: Nov. 24, 2021

(65) Prior Publication Data

US 2022/0244333 A1   Aug. 4, 2022

Related U.S. Application Data

(60) Provisional application No. 63/141,520, filed on Jan. 26, 2021.

(51) Int. Cl.
*G01R 33/48* (2006.01)
*G01R 33/54* (2006.01)
*G01R 33/56* (2006.01)
*G01R 33/561* (2006.01)

(52) U.S. Cl.
CPC ....... *G01R 33/4818* (2013.01); *G01R 33/543* (2013.01); *G01R 33/5608* (2013.01); *G01R 33/5611* (2013.01); *G01R 33/5619* (2013.01)

(58) Field of Classification Search
CPC ............. G01R 33/4818; G01R 33/543; G01R 33/5608; G01R 33/5611; G01R 33/5619
See application file for complete search history.

(56) References Cited

U.S. PATENT DOCUMENTS

| | | | | |
|---|---|---|---|---|
| 11,170,543 | B2* | 11/2021 | Cole | G06N 3/08 |
| 11,579,229 | B2* | 2/2023 | Wang | G01R 33/58 |
| 2019/0369190 | A1* | 12/2019 | Ye | G01R 33/5608 |
| 2020/0341103 | A1* | 10/2020 | Akcakaya | G06N 3/048 |

FOREIGN PATENT DOCUMENTS

CN   109671030 B  *  4/2021  ........... G06N 3/0454

OTHER PUBLICATIONS

K. H. Jin, D. Lee and J. C. Ye, "A novel k-space annihilating filter method for unification between compressed sensing and parallel MRI," 2015 IEEE 12th International Symposium on Biomedical Imaging (ISBI), Brooklyn, NY, USA, 2015, pp. 327-330, doi: 10.1109/ISBI.2015.7163879. (Year: 2015).*

(Continued)

*Primary Examiner* — Vu Le
*Assistant Examiner* — Jack Peter Kraynak
(74) *Attorney, Agent, or Firm* — Meunier Carlin & Curfman LLC

(57) ABSTRACT

The present disclosure is directed to a computational procedure for accelerated, calibrationless magnetic resonance image (CI-MRI) reconstruction that is fast, memory efficient, and scales to high dimensional imaging. The computational procedure, High-dimensional fast ConvolUtional framework (HICU), provides fast, memory-efficient recovery of unsampled k-space points.

20 Claims, 14 Drawing Sheets

(56) References Cited

OTHER PUBLICATIONS

Shen Zhao, Lee C Potter, and Rizwan Ahmad, "Highdimensional fast convolutional framework for calibrationless MRI," arXiv preprint arXiv:2004.08962, 2020.
Klaas P Pruessmann, Markus Weiger, Markus B Scheidegger, and Peter Boesiger, "SENSE: sensitivity encoding for fast MRI," Magnetic Resonance in Medicine, vol. 42, No. 5, pp. 952-962, 1999.
Mark A Griswold, Peter M Jakob, Robin M Heidemann, Mathias Nittka, Vladimir Jellus, Jianmin Wang, Berthold Kiefer, and Axel Haase, "Generalized autocalibrating partially parallel acquisitions (GRAPPA)," Magnetic Resonance in Medicine, vol. 47, No. 6, pp. 1202-1210, 2002.
Justin P. Haldar, "Low-rank modeling of local k-space neighborhoods (LORAKS) for constrained MRI," IEEE Transactions on Medical Imaging, vol. 33, No. 3, pp. 668-681, 2014.
Amir Beck and Marc Teboulle, "A fast iterative shrinkage-thresholding algorithm for linear inverse problems," SIAM Journal on Imaging Sciences, vol. 2, No. 1, pp. 183-202, 2009.
Rahul Mazumder, Trevor Hastie, and Robert Tibshirani, "Spectral regularization algorithms for learning large incomplete matrices," The Journal of Machine Learning Research, vol. 11, pp. 2287-2322, 2010.
Singanallur V Venkatakrishnan, Charles A Bouman, and Brendt Wohlberg, "Plug-and-play priors for model based reconstruction," in 2013 IEEE Global Conference on Signal and Information Processing. IEEE, 2013, pp. 945-948.
Rizwan Ahmad, Charles A Bouman, Gregery T Buzzard, Stanley Chan, Sizhuo Liu, Edward T Reehorst, and Philip Schniter, "Plug-and-play methods for magnetic resonance imaging: Using denoisers for image recovery," IEEE Signal Processing Magazine, vol. 37, No. 1, pp. 105-116, 2020.
J. Zbontar et al., "fastMRI: An open dataset and benchmarks for accelerated MRI," arXiv:1811.08839, 2018.

\* cited by examiner

HIGH-DIMENSIONAL FAST CONVOLUTIONAL FRAMEWORK (HICU) FOR CALIBRATIONLESS MRI

CROSS-REFERENCED TO RELATED APPLICATION

This application claims priority to U.S. Provisional Patent Application No. 63/141,520, filed Jan. 26, 2021, entitled "HIGH-DIMENSIONAL FAST CONVOLUTIONAL FRAMEWORK (HICU) FOR CALIBRATIONLESS MRI," the disclosure of which is incorporated herein by reference in its entirety.

STATEMENT REGARDING FEDERALLY SPONSORED RESEARCH OR DEVELOPMENT

This invention was made with government support under R01 HL135489 and R21 EB026657 awarded by the National Institutes of Health. The government has certain rights in the invention.

BACKGROUND

In magnetic resonance imaging (MRI), the k-space data are samples from the continuous Fourier transform of the underlying image. Physical and physiological limits (e.g., gradient slew rate and nerve stimulation) impede MRI acquisition efficiency, leading to long acquisition times, especially for applications that require a large corpus of k-space data such as volumetric, dynamic, or high-resolution imaging. The long acquisition time can compromise patient comfort, reduce throughput, and increase motion artifacts. Therefore, image reconstruction using less data but without losing image quality has been an active research area for three decades.

Image recovery from partially sampled k-space is typically facilitated by parallel MRI (pMRI), which is available on almost all clinical scanners. In pMRI, each of several receive coils provide k-space samples of the image modulated by a corresponding spatial sensitivity map. Sensitivity Encoding (SENSE) and GeneRalized Autocalibrating Partial Parallel Acquisition (GRAPPA) are the most commonly used pMRI reconstruction methods. SENSE uses the coil sensitivity maps to solve for the image via linear least-squares; however, SENSE reconstruction assumes sensitivity maps are known, which typically requires the acquisition of a separate scan or a fully sampled auto-calibration signal (ACS) region. By leveraging the linear dependence of one k-space sample on its neighboring samples from all coils, GRAPPA employs interpolation kernels learned from the ACS region to fill the missing k-space. Iterative Self-consistent Parallel Imaging Reconstruction from Arbitrary K-space (SPIRiT), a generalization of GRAPPA, reorganizes interpolators into annihilating kernels. Parallel Reconstruction Using Null Operations (PRUNO) generalizes GRAPPA to use a nullspace spanned by multiple annihilating kernels extracted from the ACS region.

To enable higher acceleration rates and increase flexibility in sampling pattern design, image-based and k-space-based calibrationless MRI (CI-MRI) methods have been proposed and validated in research settings. Most k-space-based methods treat the recovery as a structured low-rank matrix completion problem with respect to a convolutional matrix constructed from the original k-space or weighted k-space samples. The rank deficiency results from the shift-invariant linear dependence of one k-space sample on its neighboring samples from all coils. This linear dependence originates from several sources, including multi-coil data structure, limited image support, slowly varying image phase, multi-shot imaging, piece-wise polynomial image content, and other transform domain sparsity.

Although k-space-based low-rank matrix completion methods all leverage rank deficiency, each may employ a specific optimization formulation or adopt a different optimization algorithm. For example, Simultaneous Auto-calibrating and K-space Estimation (SAKE) minimizes the data mismatch subject to a hard rank constraint on the convolutional matrix using Cadzow's algorithm. Low-rank Modeling of Local K-space Neighborhoods (LORAKS) minimizes the sum of the squared tail singular values of the convolutional matrix with hard data consistency using the majorize-minimize (MM) algorithm; soft data consistency and slowly varying image phase are also optional constraints in LORAKS. For k-space based CI-MRI methods, large memory requirement and enormous computation burden have been identified as challenges. Several algorithms aim to address these issues. For example, Generic Iterative Reweighted Annihilation Filter (GIRAF) extracts spectral information from the Gram matrix built from the convolution operator instead of directly computing a singular value decomposition of a large block-Hankel matrix. Moreover, a "half-circulant" padding approximation and fast Fourier transform (FFT) increase the speed of GIRAF. Using a synthetic ACS strategy combined with SENSE, LORAKS has been extended to 3D static imaging with reduced memory and computation requirements. Likewise, through the use of slice-by-slice reconstruction in the readout direction, Annihilating Filter-Based Low Rank Hankel Matrix Approach (ALOHA) has been extended to 2D cine (2D+t) imaging. Despite these computational advances, the clinical application of k-space based CI-MRI methods is still limited by a computation complexity that is not competitive with regularized SENSE-based methods.

Thus, there is a need for a numerical procedure that provides the advantages of: (i) a small memory footprint; (ii) fast computation that is competitive with SENSE-based imaging; (iii) seamless scalability to many MRI applications, regardless of the number of data dimensions arising from space, time, coils, or encodings; (iv) and, better reconstruction quality than SENSE-based compressed sensing (CS) reconstruction.

SUMMARY

Disclosed herein are systems and methods for a computational procedure for accelerated, calibrationless magnetic resonance image (CI-MRI) reconstruction that is fast, memory efficient, and scales to high dimensional imaging. The computational procedure, High-dimensional fast ConvolUtional framework (HICU), provides fast, memory-efficient recovery of unsampled k-space points.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

A detailed description of certain aspects of the present disclosure in accordance with various example implementations will now be provided with reference to the accompanying drawings. The drawings form a part hereof and show, by way of illustration, specific implementations and examples. In referring to the drawings, like numerals represent like elements throughout the several figures.

DETAILED DESCRIPTION OF THE DISCLOSURE

Introduction

Figure 1:
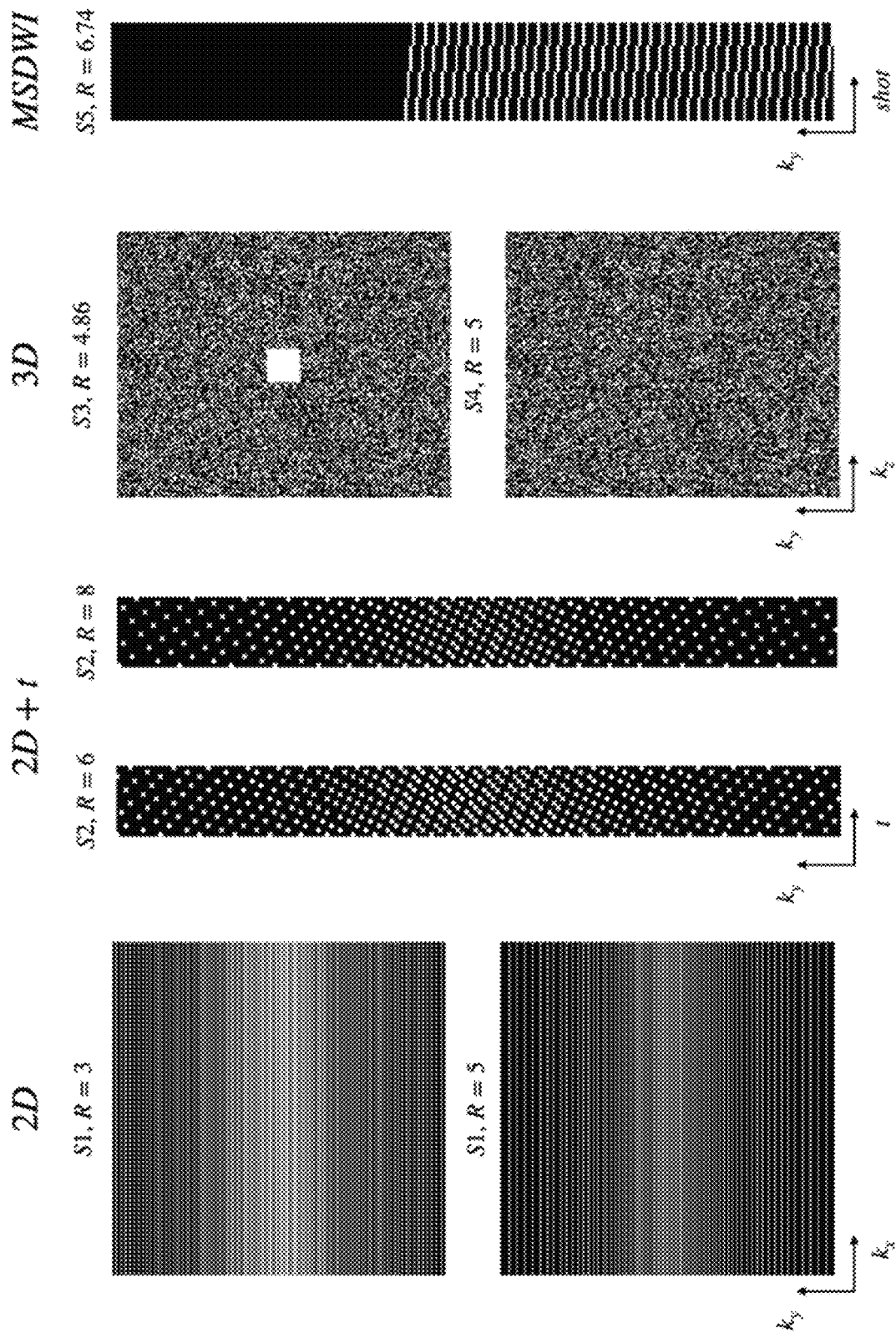
FIG. 1 illustrates sampling patterns (S1 to S5) and acceleration rates used in the 2D, 2D+t, 3D, multi-shot diffusion weighted imaging (MSDWI) studies.

There are known parallel imaging methods that exploit the linear dependence of one k-space sample on its neighboring samples from all coils. These correlations arise both from the multi-channel interrogation of a single image using spatially smooth coil sensitivity maps and from image structure itself. The dependencies yield rank deficiency in a multi-dimensional convolution matrix formed from the data, and hence the existence of annihilating kernels for the multi-dimensional k-space data. Let $\mathbb{X}$ denote the multi-dimensional array of k-space samples, and x denote the N—by-1 vectorization of the complex-valued entries in $\mathbb{X}$. For example, for a 2D+t application, the size of the four-dimensional array $\mathbb{X}$ is $[N_x, N_y, N_t, N_c]$, representing $N_x$ frequency encoding samples, $N_y$ phase encoding samples, $N_t$ time frames, and $N_c$, coils. Let $\mathbb{K}$ be a {0, 1}-valued mask indicating the support of an annihilating kernel, with values on the support of $\mathbb{K}$ vectorized into the n—by—1 list v. Let $\mathcal{H}_{\mathbb{K}}\{\mathbb{X}\}$ denote the m-by-n multi-level Hankel matrix generated from the k-space array $\mathbb{X}$ such that multiplication $\mathcal{H}_{\mathbb{K}}\{X\}v$ is the vectorization of the valid convolution of $\mathbb{X}$ with multi-dimensional kernel described by v. In contrast to circular and linear convolutions, valid convolution generates only those output points that do not depend on any boundary conditions. Thus, the data array $\mathbb{X}$ is lifted to a much larger, multi-level Hankel matrix, and rank of the matrix becomes a powerful implicit modeling tool. For accelerated imaging, only a fraction of the elements of $\mathbb{X}$ are observed; let $\mathbb{X}_0$ be the array of observed data zero-filled to match the array size of $\mathbb{X}$.

Recovery of the unobserved k-space samples may be posed as a structured low-rank matrix completion problem. Many approaches relax the non-convex rank constraint, rank$\{\mathcal{H}_{\mathbb{K}}\{\mathbb{X}\}\}\leq r$ to the nuclear norm minimization, which equals to minimizing the sum of all singular values. Instead, the squared distance of the completed multi-level Hankel matrix to the set of matrices with rank not exceeding r may be chosen as a cost function:

$$J(x)=\Sigma_{k>r}\sigma_k^2\{\mathcal{H}_{\mathbb{K}}\{\mathbb{X}\}\} \tag{1}$$

where $\sigma_k\{A\}$ denotes the $k^{th}$ largest singular value of a matrix A. This cost function was introduced in the LORAKS framework and is the sum of squares of the tail singular values, $\sigma_k$ for k>r, of the multi-level Hankel matrix formed from the k-space array, X. This cost may be minimized subject to constraints, $f_i(x)=0$, i=1, . . . , c. An example constraint is data fidelity, $f_1(x)=\|\mathbb{M}\circ\mathbb{X}-\mathbb{X}_0\|_F^2$, where $\mathbb{M}$ is the {0, 1}—valued mask indicating observed k-space locations, ° denotes element-wise multiplication, and $\|\cdot\|_F$ denotes the Frobenius norm. In general, the constrained minimizer, x*, yields J(x*)>0 and the matrix completion is only approximately rank r.

Given annihilating kernel mask $\mathbb{K}$, we adopt for the m-by-n multi-level Hankel matrix the shorthand notation $H(x)=\mathcal{H}_{\mathbb{K}}(\mathbb{X})$, and use H'(x) to denote the conjugate transpose. The cost, J(x), in (1) is readily seen to $$\min_{Q}\sum_{j=r+1}^{n}\|H(x)Q\|_F^2.$$

Each of the n–r orthonormal columns of Q specifies an approximate annihilating filter, and J(x) is the residual energy, after valid convolution, summed across all n–r approximate annihilating kernels.

Thus, in a High-dimensional fast ConvolUtional framework (HICU), the matrix completion task is formulated as the optimization:

$$\min_{x,Q}\|H(x)Q\|_F^2 + \sum_{i=1}^{c}\lambda_i f_i(x), Q'Q = I, \tag{2}$$

To optimize over x and Q, an alternating minimization strategy is adopted:first update the basis, Q, then update the unobserved k-space samples, x. The cost function pairs quite amicably with four numerical techniques that, taken together, yield both fast computation and low memory requirement. As a result, HICU is given in Algorithm 1 (below). By choosing an annihilating kernel of size $N_c$ in the coil dimension, valid convolution affects a sum across all coils, while maintaining the conceptual simplicity of a single multi-dimensional convolution.

ALGORITHM 1

Input: Zero-filled observed k-space, $\mathcal{X}_0$; Sampling mask, $\mathcal{M}$; Kernel mask, $\mathcal{K}$;
Region of k-space,
$\mathcal{S}^{(i)}$; Rauk, r; Compression dimension, p; Number of iterations, I; Number of gradient
steps per iteration, $G^{(i)}$; Initialize $x^{(0)} = \text{vec}\{\mathcal{X}_0\}$ 1: for i = 1 to I do
2:   Compute $V^{(i)}$, r principal right singular vectors of $H^{(i-1)}(x^{(i-1)})$ via rSVD       rSVD
3:   Compute orthonormal basis, $Q^{(i)}$, orthogonal to $V^{(i)}$ via r Householder
     reflections
4:   Select region, $\mathcal{S}^{(i)}$, on which to compute valid convolution using $H^{(i)}(x^{(i-1)})$       CO
5:   Prepare for $G^{(i)}$ descent steps, $y^{(0)} = x^{(i-1)}$
6:   for j = 1 to $G^{(i)}$ do
7:     Compress nullspace to p dimensions, $\tilde{Q}^{(i,j)} = Q^{(i)} P^{(i,j)}$, where $P^{(i,j)}$ is i.i.d.       JL
       normal
8:     Compute gradient, $g^{(j)} = \Sigma_{k=1}^{p} \nabla_y ||H^{(i)}(y^{(j-1)})\tilde{q}_k^{(i,j)}||^2 + \Sigma_{l=1}^{c} \lambda_c \nabla_y f_l(y^{(j-1)})$
9:     Update with step size set by exact line search, $y^{(j)} = y^{(j-1)} - \eta^{(j)} g^{(j)}$       ELS
10:  end for
11:  Save result of gradient steps, $x^{(i)} = y^{(G^{(i)})}$
12: end for
Output: Reconstructed k-space, $x^{(I)}$

---

Consider now the four numerical techniques adopted in Algorithm 1. Randomization may first be used to efficiently compute a nullspace basis. To this end, the randomized singular value decomposition (rSVD) may be used to compute the n-by-r matrix, $V^{(i)}$, corresponding to the principal r right singular values of $H(x^{(i-1)})$; the update to $Q^{(i)}$ then completed from $V^{(i)}$ using r Householder reflections. So, $Q^{(i)}$ minimizes over all Q'Q=I for fixed $x^{(i-1)}$. The rSVD can compute the r principal right singular vectors, $V^{(i)}$, to high precision using only ⅔r applications of the multi-dimensional valid convolution, $H(x^{(i-1)})$, and its conjugate transpose, $H'(X^{(i-1)})$, which is itself a valid convolution operation. Thus, rSVD avoids explicit construction of both the large multi-level Hankel matrix and its Gram matrix, sidestepping the associated memory requirement and computation time. Compared to other truncated SVD techniques, such as Lanczos bidiagonalization algorithm found in PROPACK, rSVD is more stable and inherently amenable to parallel computing. Recent studies have shown that rSVD methods can be significantly faster compared to the truncated SVD implementation in PROPACK.

Next, we make a number, $G^{(i)}$, of gradient descent steps on x for fixed $Q^{(i)}$. A gradient descent step updates the unobserved k-space points to reduce the energy in the set of annihilator outputs, as constrained by the costs $\lambda_i f_i(x)$. The number of steps can be chosen to balance computational cost between the rSVD to update $Q^{(i)}$ and the total collection of GU) gradient descent steps to update $x^{(i)}$. Only a few gradient steps are required, and computation does not benefit from full convergence for a fixed nullspace estimate, $Q^{(i)}$.

Exact computation of the gradient of $||H(x^{(i-1)})Q^{(i)}||_F^2$ for fixed $Q^{(i)}$ requires a sum over all annihilating kernels of the composition of two convolutions. So, at each gradient step we adopt a second numerical technique for speed while preserving the correct mean gradient direction: motivated by the random mixing of dimension reduction in the Johnson-Lindenstrauss (JL) Lemma, we reduce $Q^{(i)}$ to p columns. Specifically, before computing a gradient direction, we use an n-by-p matrix, $P^{(i,j)}$, of i.i.d. zero-mean Gaussian entries with variance 1/p to project $Q^{(i)}$ to a smaller p-dimensional nullspace, $\tilde{Q}^{(i,j)} = Q^{(i)} P^{(i,j)}$. Compared to randomly sampling p columns from $Q^{(i)}$, the JL compression provides implicit preconditioning.

Third, exact line search (ELS) can be efficiently implemented for 1(x) paired with many choices of $f_i$, providing the minimum of the cost function in [2] in the direction of the negative of the gradient and obviating any need for a step-size heuristic or iterative line search. The step size at Step 9 of Algorithm 1 is found via one convolution with each of the p small annihilating kernels in $\tilde{Q}^{(i,j)}$.

Fourth, the region of k-space, $\mathcal{S}^{(i)}$, on which the valid convolution is computed in Steps 2 and 8 does not affect the n-by-r matrix of principal right singular vectors in the idealized noiseless case. Therefore, invoking shift invariance across the spatial frequency dimensions in k-space, the region may be restricted to small subsets of the full k-space. In this manner, a high signal-to-noise ratio (SNR), undersampled, small region at the center of k-space may be used to rapidly determine an approximate solution for $Q^{(i)}$. Subsequent iterations can use more or all of the k-space to both refine $Q^{(i)}$ and estimate the full k-space data array, X. We refer to this strategy as center-out (CO). A similar use of the center of k-space is found, for example, in SAKE and Wave-LORAKS where an auto-calibration region is synthesized as a pre-processing step to a SENSE reconstruction. In Algorithm 1, the abbreviated notation $H^{(i)}(x^{(i-1)})$ is used to denote this potentially much smaller multi-level Hankel matrix constructed using a portion, $\mathcal{S}^{(i)}$, of the full k-space at iteration i.

Let $s = |\mathcal{S}^{(i)}|$ be the number of output points from the valid convolution region at iteration i. Recall $n = |\mathcal{K}|$ is the number of convolution kernel samples, and r is the rank; note r<n<s. The complexity of gradient computation with ELS is roughly 3nps, and the rSVD complexity is roughly 3nrs. Note that r generally grows with number of dimensions in the data array, X. Thus, for high dimensional problems, the ratio r/p grows large, leaving the rSVD much more costly than a single gradient descent step. The memory requirement is approximately N, the size of k-space array X, plus 1.5rs.

The combination of the optimization objective [2] and four numerical techniques adopted here—CO, rSVD, JL, ELS—provides significant savings in computation time for memory-efficient completion of a multi-level Hankel matrix with approximate rank deficiency. The moniker "High-dimensional fast ConvolUtional framework" refers to the simple and exclusive reliance in Algorithm 1 on multi-dimensional convolutions, $H^{(i)}(x^{(i-1)})$ and $H^{(i)'}(x^{(i-1)})$, at each step of the alternating minimization, and the name points to the attendant scalability of memory and computation to large k-space arrays, X.

Below, we present numerical results for HICU computation for the case of exact data matching; this allows direct comparison with publicly available code for SAKE and coincides with one specific cost function found in the LORAKS 2.1 suite, namely C-based LORAKS with hard data constraint. To achieve data matching in HICU, we simply set, in Step 8 of Algorithm 1, the gradient of J(x) equal to zero at observed k-space locations.

In existing art (Uschmajew and Vandereycken, 2020), a local minimum of the cost J(x) may be found via Riemannian descent. At each iteration, the projection to the manifold of low-rank matrices is given by USV', where U is m by r and V is n by r. Descent steps are then taken along the tangent subspace, {M:M=UA'+BV' for some A, B}, followed by re-projection to the rank r manifold. In contrast to HICU, Riemannian descent requires computation and memory storage for the large matrices U and A. HICU implicitly determines {A=0,B} while using the parsimonious parameterization of the data array, x, but nonetheless provides a valid descent direction and maintains a linear convergence rate.

Methods

We evaluated HICU using four in vivo studies: 2D static imaging of the brain (Study I), 2D+t imaging of the heart (Study II), 3D imaging of the knee (Study III), and MSDWI of the brain (Study IV).

MR Acquisition

In Study I, six T2-weighted pMRI brain datasets, B1, B2, . . . , B6, were taken from the New York University fastMRI database. All datasets were fully sampled and collected in an axial orientation on 3 T scanners using a T2-weighted turbo spin-echo sequence. Other imaging parameters included: TE 113 ms, TR 6,000-6,570 ms, TI 100 ms, field-of-view (FOV) 220 mm x 227 mm, slice thickness 7.5 mm, matrix size 384×384, number of receive coils 16-20, and flip angle 149-180 degrees. The center slice from each dataset was used. The 2D datasets were retrospectively undersampled using a variable density sampling pattern, S1, at rates R=3 and R=5, as shown in FIG. 1. The pattern S1 had at most two contiguous readouts at R=3 and no contiguous readouts at R=5.

In Study II, seven fully sampled 2D+t cardiac datasets C1, C2, . . . ,C7 were collected from seven healthy volunteers using a balanced steady-state free precession sequence under breath-hold with prospective triggering. The data were collected at The Ohio State University and Nationwide Children's Hospital, with the ethical approval for recruitment and consent given by an Internal Review Board. Three short-axis oriented and four long-axis oriented fully sampled segmented datasets were collected on 3 T scanners (MAGNETOM Prisma, Siemens Healthineers, Erlangen, Germany). Other imaging parameters included: TE 1.48-1.53 ms, TR 2.95-3.05 ms, FOV 380-400 mm x 285-325 mm, slice thickness 8 mm, matrix size 176-384×12-156, number of frames 16-25, temporal resolution 36.6-38.35 ms, number of receive coils 20-34, and flip angle 33-42 degrees. The 2D+t datasets were retrospectively undersampled at R=6 and R=8 using a variable density pseudo-random sampling pattern 52 shown in FIG. 1. ALOHA reconstruction requires sampling of the center phase encoding line; therefore, for the ALOHA method only that we added an additional line to the sampling pattern for each frame, resulting in slightly lower acceleration rates of R=5.77 and 7.61.

In Study III, five 3 T 3D knee datasets, D1, D2, . . . , D5 from www.mridata.org were used. The spin-echo imaging parameters included: receiver bandwidth 50 kHz, number of coils $N_c$=8, FOV 160 mm×160 mm×153.6 mm, matrix size 320×320×256, repetition time 1550 ms, echo time 25 ms, and flip angle 90 degrees. The datasets were retrospectively undersampled along the phase encoding dimensions using 2D random sampling patterns S3 and S4 shown in FIG. 1. Pattern S4 is 2D random sampling with rate R=5, while S3 augments S4 with a 32×32 fully sampled center region to yield R=4.86.

In Study IV, one ten-slice dataset was provided courtesy of the University of Iowa. The data were acquired from a healthy volunteer on a 3 T GE Discovery MR750W (GE Healthcare, Waukesha) using a four-shot ($N_s$=4) dual spin echo diffusion sequence. Parameters included: partial Fourier 59%, TE 84 ms for b-value of 700 s/mm², FOV 210×210 mm, sampling matrix 256×152, slice thickness 4 mm, slice number 10, NEX=2, 32 coils, one non-diffusion image, and 60 diffusion directions. The prospective sampling pattern for four shots is S5 with acceleration rate R=6.74, as shown in FIG. 1. Detailed description of the dataset is provided in (13)

MR Reconstruction and Analysis

In Study I, the datasets were compressed to $N_c$=8 virtual coils before reconstruction. For comparison, we include three reconstruction methods: SAKE using the authors' publicly available Matlab code, LORAKS 2.1 using the authors' publicly available Matlab code; and Image Reconstruction by Regularized Nonlinear Inversion (NLINV) using compiled C code from the Berkeley Advanced Reconstruction Toolbox (BART). To allow uniform comparison to SAKE, the C-based version of LORAKS was used, and kernels for HICU and LORAKS were restricted to rectangular support of size [5, 5, $N_c$]. The sixth dataset, 86 at (S1, R=S), was used to tune the rank for SAKE, LORAKS, and HICU manually to maximize the signal-to-error ratio (SER) defined as $20 \log_{10}(|\mathbb{X} - \mathbb{X}|_F / |\mathbb{X}|_F)$. The remaining five datasets were then used for performance evaluation at one hour execution time. Coincidentally, SAKE, LORAKS, and HICU all shared the same best rank, r=30. For LORAKS, algorithm choices were set for consistent comparison to SAKE, i.e., hard data consistency and no virtual conjugate coils. Additionally, the multiplicative half-quadratic algorithm using FFT approximation was chosen with LORAKS for execution speed. From computed results, the SER versus time for SAKE, LORAKS, and HICU was averaged over B1, B2, . . . , B5. For NLINV, the input zero-filled k-space was scaled to have the Frobenius norm equal to 100. The number of iterations for NLINV was tuned to maximize the SER for (B6, S1, R=3) and (B6, S1, R=5). SER for NLINV at each iteration is not available from the compiled code; thus, only the final SER is reported for NLINV. For the first stage of HICU, the size of the CO region was set at ¼ $N_x$×¼ $N_y$×$N_c$, with p=$N_c$=8 and $G^{(i)}$=5 gradient steps per update of the nullspace. For the second stage, the full k-space was used with p=4$N_c$=32 and $G^{(i)}$=10. From the tuning results, the number of iterations for the first stage was set at 50 for R=3 and 200 for R=5. Coil images were combined via square-root sum of squares (SSoS).

For all four methods, the mean and standard deviation were computed for four metrics: k-space SER in dB, high frequency error norm (HFEN) in dB, structural similarity index (SSIM), which was averaged across all coil magnitude images, and the time, $T_c$, to reach within 0.1 dB of the SER achieved at one hour (except for NLINV). For NLINV, $T_c$ corresponds to the computation time to run 14, 15 iterations for R=3, 5. To illustrate the effect of p in HICU, the SER curves for (B1, S1, R=3) were computed for six values of p ranging from 1 to n r=170. To illuminate the separate and joint effects of CO and JL strategies in HICU, the SER curves for (B1, S1, R=5) were computed for all four combinations of using or omitting the strategies.

In Study II, the data were compressed to $N_c=12$ virtual coils before reconstruction. For comparison, we included four reconstruction methods: ALOHA; total-variation (TV) penalty using MFISTA; soft-thresholding of non-decimated wavelet transform (NWT) using balanced FISTA; and low-rank plus sparse (L+S). The seventh dataset C7 at (S3, R=8) was withheld to determine the tuning parameters. For all methods, the initialization was the time-averaged k-space; if a phase encoding point was not sampled across all frames, then zero filling was used. For TV, NWT, and L+S, the number of iterations was 150, and the sensitivity maps were estimated from time-averaged k-space using the method by Walsh et al. The number of iterations and tolerance for two stages of ALOHA were set to [500, 500] and [$10^{-2}$, $10^{-3}$]; the ALOHA kernel size was [5, 5]. For HICU, the kernel size was [5, 5, 5, $N_c$], rank r=10, $p=N_c=12$, and the total number of iterations I=101. For the first 100 HICU iterations, $S^{(i)}$ was the center $¼N_x \times ¼N_y \times N_t \times N_C$ and $G^{(i)}=5$; $S^{(101)}$ was the full k-space and $G^{(101)}=100$. In HICU computation, the convolution in the time dimension was circular, rather than valid. We consistently observed 0.2 to 0.3 dB SER gain with circular convolution along time, compared to valid convolution. For the three SENSE-based methods, the reconstruction results were converted into coil images via pixel-wise multiplication of the reconstructed image with the sensitivity maps. For all five methods, the mean and standard deviation were computed for four metrics: k-space SER, HFEN, SSIM, and compute time.

In Study III, we compared HICU to two reconstruction methods: SENSE-based reconstruction with regularization of wavelet transform (WT) sparsity using BART; and, NLINV using BART. The fifth dataset D5 was withheld to determine the tuning parameters. For HICU and NLINV, the parameters were based on sampling pattern S5 and used for both S4 and S5. For WT, one set of coil sensitivity maps was extracted using ESPIRiT; parameters were $\lambda=0.01$ and 150 FISTA iterations. For NLINV, the observed k-space was scaled to have Frobenius norm 25, 600, and the number of iterations was set at 18. For HICU, the kernel size was [5, 5, 5, $N_c$], rank r=150, $p=N_c=8$, and I=11. For the first ten iterations, $S^{(i)}$ was $¼N_x \times ¼N_y \times ¼N_z \times N_c$ and $G^{(i)}=5$. $S^{(11)}$ was the full k-space, and $G^{(11)}=20$. For all five methods, the mean and standard deviation were computed for four metrics: k-space SER, HFEN, SSIM, and computing time.

In Study IV, reconstruction for each slice was performed separately after compressing to $N_c=8$ virtual coils. IRLS MUSSELS with conjugate symmetry was used for comparison. For IRLS MUSSELS, the coil sensitivity map was extracted using ESPIRiT based on the sum of the 4 shots for the non-diffusion image. The kernel size was [5, 5]; execution employed 10 outer iterations and 8 inner iterations, with regularization parameter $\Lambda=0.005$. HICU was applied separately for each b value because the phase modulation due to multi-shot varies with diffusion weighting. To better accommodate the uniform downsampling, the nullspace was augmented [Q|Q$_+$] in Step 3 of Algorithm 1 using information from the non-diffusion (b0) measurement. Forty null vectors, $Q_0$, are computed using the sum of the four shots at b0. Then, $Q_+$ is a block diagonal matrix, with four repetitions of $Q_0$ along the diagonal. For HICU, the kernel size was [5, 5, $N_c$, $N_s$], rank r=45, $p=N_c=8$, and I=51. For the first 50 iterations, $S^{(i)}$ was center $¼N_x \times ¼N_y \times N_c \times N_8$ and $G(i)=5$; $S^{(51)}$ was the partial Fourier sampled region of k-space, with $G^{(51)}=100$. HICU matrix completion was followed by homodyne partial Fourier reconstruction. In absence of fully sampled data, no quantitative metrics were computed.

For all studies, processing was conducted in Matlab 2020a (Mathworks, Natick, Mass., US) on an Alienware Aurora Ryzen™ desktop, equipped with an AMD Ryzen 3950X CPU and 64 GB memory. The Matlab code for HICU is provided at httpsligithub.com/OSU-CMR/HICU.

Results

Figure 2:
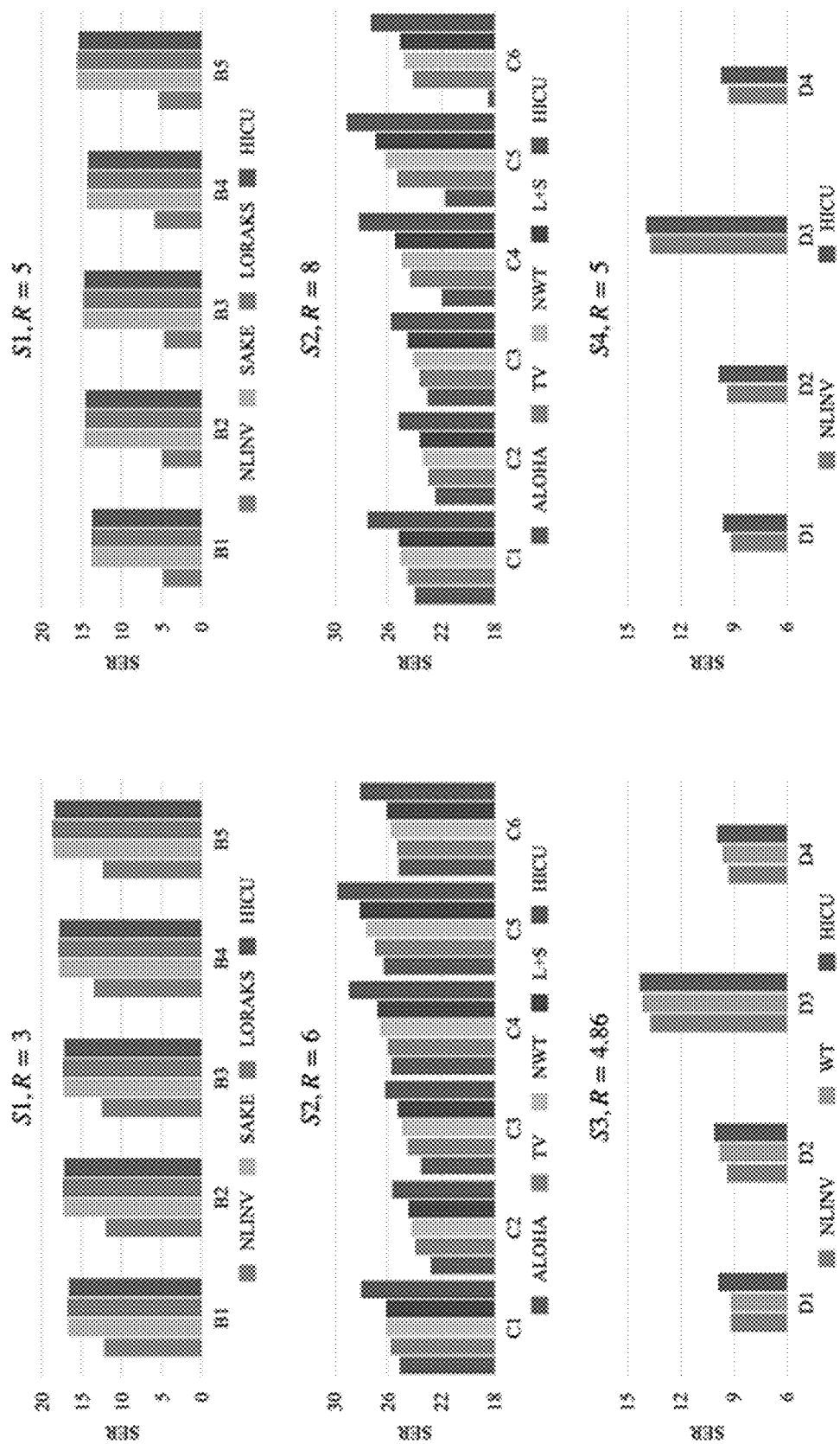
FIG. 2 illustrates SER of reconstructions from all methods for all datasets and sampling patterns S1, . . . , S4.

For the first three studies, Table 1 reports the mean and standard deviation of quantitative metrics for all datasets, sampling patterns, and accelerations. FIG. 2 shows the SER for each dataset.

TABLE 1

| 2D | S1, R = 3 | | | | S1, R = 5 | | | |
|---|---|---|---|---|---|---|---|---|
| | SER (dB) | SSIM | HFEN (dB) | Tc (s) | SER (dB) | SSIM | HFEN (dB) | Tc (s) |
| NLINV | 12.62 ± 0.53 | 0.575 ± 0.029 | −9.82 ± 0.49 | 18.2 ± 1.7 | 5.20 ± 0.44 | 0.422 ± 0.028 | −3.69 ± 0.57 | 21.7 ± 1.3 |
| SAKE | 17.62 ± 0.63 | 0.715 ± 0.030 | −14.13 ± 0.84 | 239.1 ± 71.7 | 14.73 ± 0.59 | 0.634 ± 0.036 | −11.02 ± 0.73 | 966.2 ± 486.6 |
| LORAKS | 17.73 ± 0.63 | 0.715 ± 0.030 | −14.13 ± 0.84 | 84.9 ± 6.6 | 14.69 ± 0.60 | 0.634 ± 0.037 | −10.99 ± 0.72 | 566.7 ± 156.6 |
| HICU | 17.50 ± 0.60 | 0.714 ± 0.030 | −13.87 ± 0.83 | 4.4 ± 0.5 | 14.59 ± 0.56 | 0.640 ± 0.036 | −10.92 ± 0.72 | 13.8 ± 2.9 |

| 2D + t | S2, R = 6 | | | | S2, R = 8 | | | |
|---|---|---|---|---|---|---|---|---|
| | SER (dB) | SSIM | HFEN (dB) | Time (s) | SER (dB) | SSIM | HFEN (dB) | Time (s) |
| ALOHA | 24.80 ± 1.37 | 0.958 ± 0.017 | −24.70 ± 0.68 | 4830 ± 495 | 21.94 ± 1.88 | 0.948 ± 0.013 | −21.00 ± 3.17 | 4532 ± 446 |
| TV | 25.45 ± 1.10 | 0.959 ± 0.013 | −25.29 ± 1.29 | 87.6 ± 8.2 | 24.17 ± 0.81 | 0.957 ± 0.011 | −23.73 ± 1.48 | 87.6 ± 9.1 |
| NWT | 25.90 ± 1.20 | 0.956 ± 0.013 | −25.64 ± 1.31 | 78.2 ± 7.4 | 24.78 ± 0.96 | 0.955 ± 0.012 | −24.20 ± 1.50 | 78.7 ± 8.4 |
| L + S | 26.16 ± 1.27 | 0.960 ± 0.013 | −25.86 ± 1.45 | 90.1 ± 13.3 | 25.15 ± 1.08 | 0.959 ± 0.011 | −24.59 ± 1.58 | 90.2 ± 13.3 |
| HICU | 27.90 ± 1.58 | 0.964 ± 0.013 | −27.29 ± 1.10 | 350.5 ± 31.5 | 27.19 ± 1.47 | 0.959 ± 0.014 | −26.48 ± 1.05 | 350.4 ± 30.8 |

| 3D | S3, R = 4.86 | | | | S4, R = 5 | | | |
|---|---|---|---|---|---|---|---|---|
| | SER (dB) | SSIM | HFEN (dB) | Time (s) | SER (dB) | SSIM | HFEN (dB) | Time (s) |
| NLINV | 10.38 ± 2.22 | 0.619 ± 0.120 | −6.87 ± 1.48 | 657.4 ± 14.3 | 9.81 ± 1.95 | 0.698 ± 0.113 | −6.67 ± 1.35 | 653.1 ± 11.7 |
| WT | 10.68 ± 2.33 | 0.723 ± 0.105 | −7.06 ± 1.46 | 695.3 ± 23.2 | N/A | N/A | N/A | N/A |
| HICU | 11.05 ± 2.17 | 0.826 ± 0.069 | −7.37 ± 1.25 | 515.1 ± 2.2 | 10.68 ± 2.11 | 0.822 ± 0.075 | −7.12 ± 1.25 | 515.7 ± 1.6 |

TABLE 1-continued

| | | S5, R = 6.74 | | |
|---|---|---|---|---|
| MSDWI | SER (dB) | SSIM | HFEN (dB) | Time (s) |
| MUSSELS | N/A | N/A | N/A | 5397.9 |
| HICU | N/A | N/A | N/A | 1061.9 |

Figure 3:
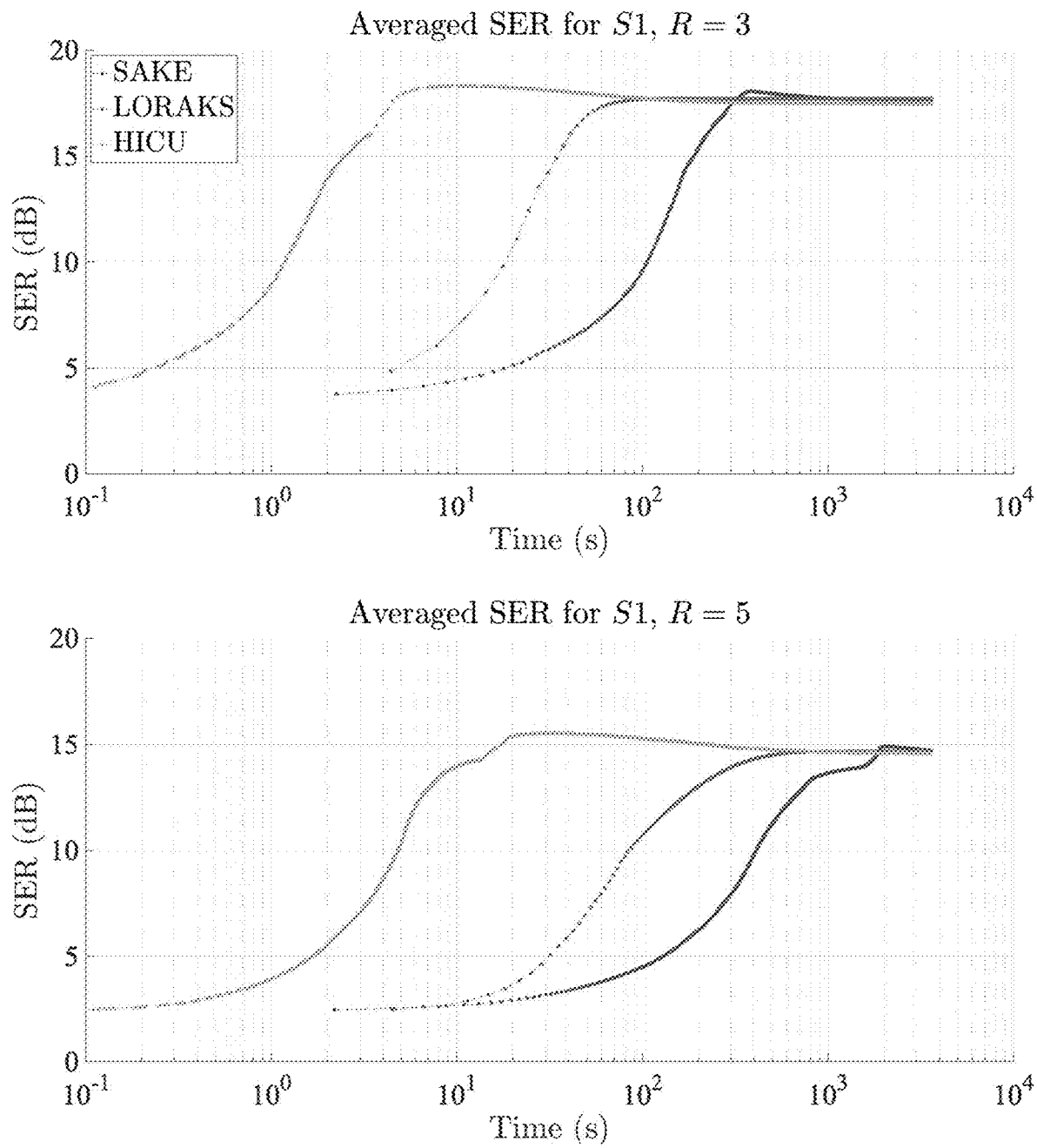
FIG. 3 illustrates SER versus runtime for S1, R=3 and S1, R=5, where each curve represents SER values that are averaged over five datasets.
Figure 4:
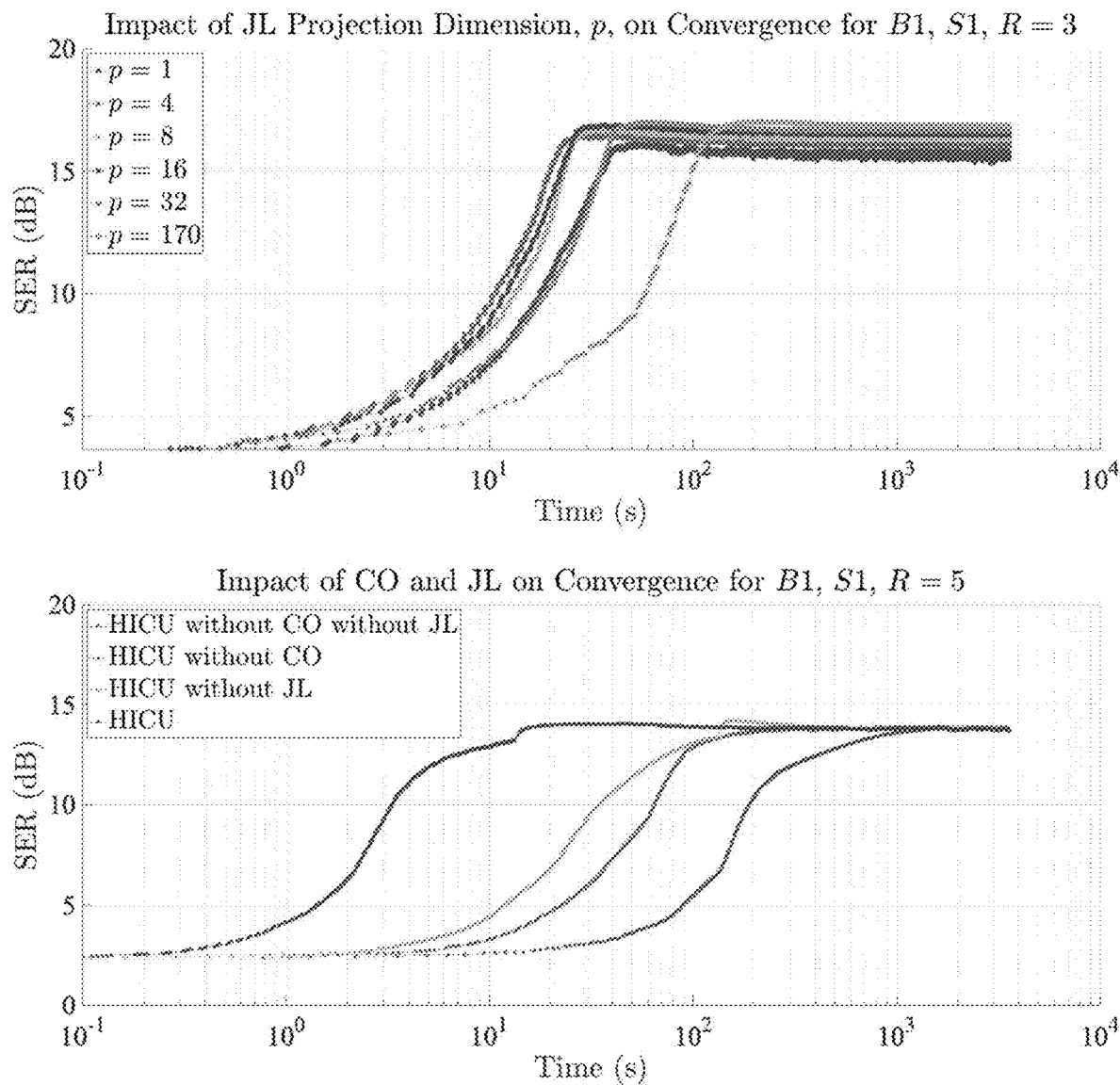
FIG. 4 illustrates the effect of JL on convergence speed for p=1, 4, 8,16, 32,170 for (B1, S1, R=3) and the impact of CO and JL on convergence speed for (B1, S1, R=5)
Figure 5:
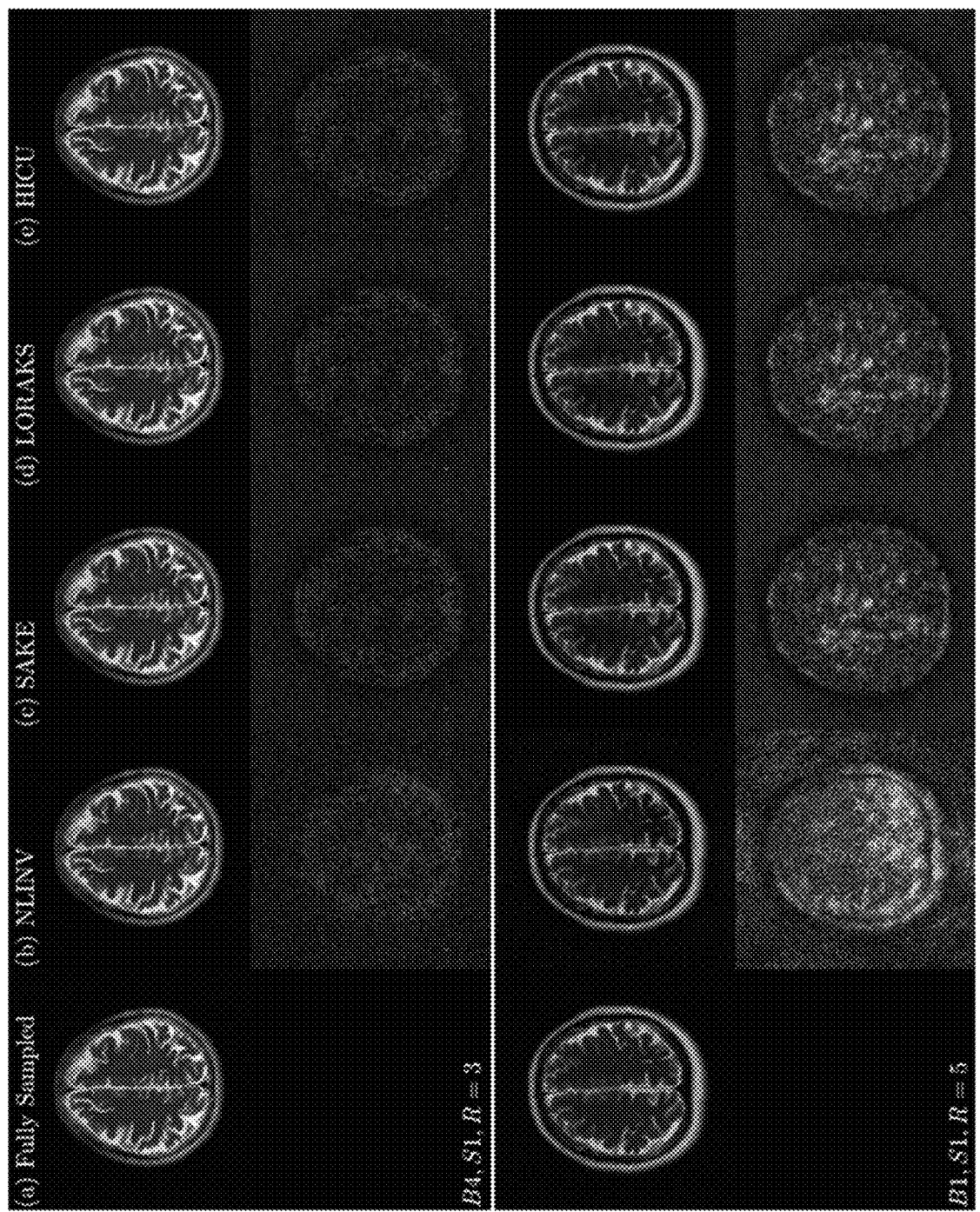
FIG. 5 illustrates SSoS images for SAKE, LORAKS, HICU at one hour and NLINV at the final iteration, and 10× absolute error relative to fully sampled k-space.

For Study I, the memory requirements for SAKE, LORAKS, NLINV, and HICU were approximately 450 MB, 450 MB, 10 MB, and 18 MB, respectively. FIG. 3 shows the average SER versus runtime for SAKE, LORAKS, and HICU for (S1, R=3) and (S1, R=5). Time in seconds is plotted logarithmically to illuminate computing time ratios and simultaneously view time on the scale of hours, minutes, and seconds. FIG. 4 shows SER versus runtime for six choices of p with CO disabled to explore the effect of the JL projection dimension, p, for (B1, S1, R=3); this figure also shows SER versus runtime for four HICU variants with and without the CO and JL numerical strategies for (B1, S1, R=5). FIG. 5 shows the SSoS reconstruction images for (B4, S1, R=3) and (B1, S1, R=5), the two datasets that yielded the highest and lowest SER from FIG. 2.

For Study II reported in Table 1, HICU yields the highest average SER, SSIM, and HFEN. For display of representative images, we selected the two combinations of dataset, sampling pattern, and acceleration rate that yielded the highest and lowest SER values in FIG. 2.

Figure 7:
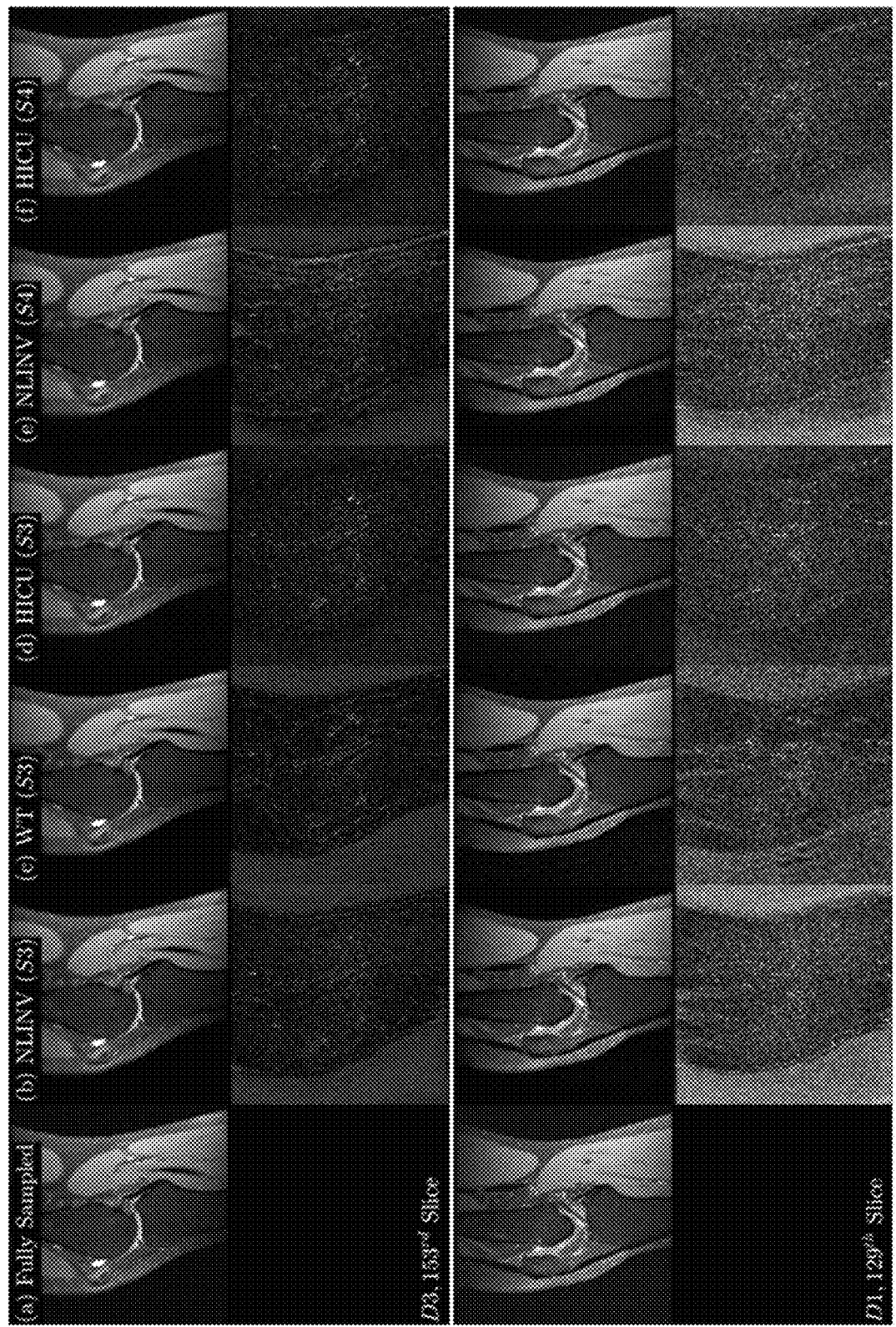
FIG. 7 illustrates an SSoS image for all methods of 153rd slice of D3 and 129th slice of D1, and a 7× absolute error.
Figure 8:
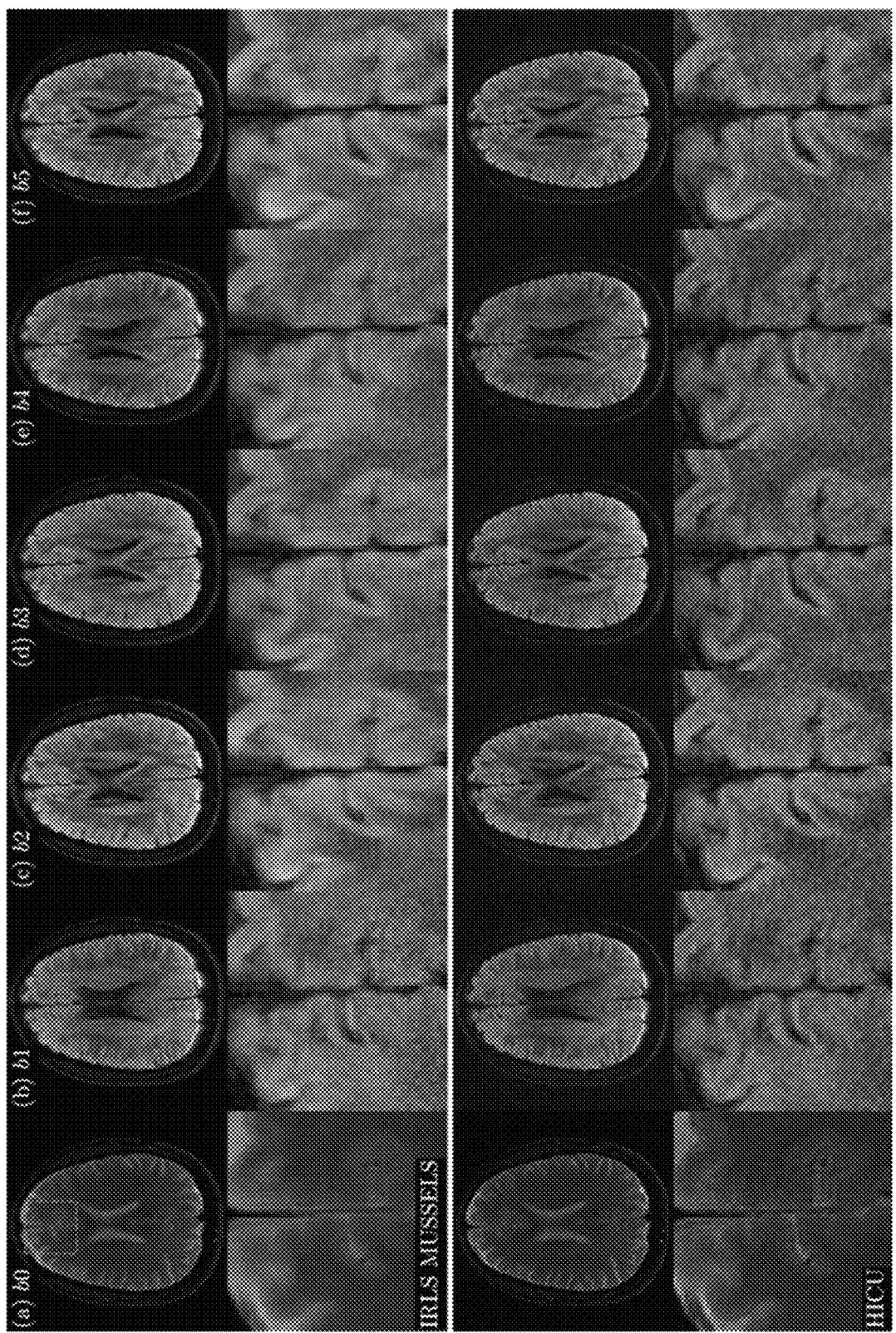
FIG. 8 illustrates a SSoS image for HICU and IRLS MUSSELS with conjugate symmetry for b0, . . . , b5 and results from the 6th slice.

For Study III reported in Table 1, HICU yields the highest average SER, SSIM, and HFEN. FIG. 7 shows the reconstruction results from D3 and D1, which had the highest and lowest average k-space SER in FIG. 2. For Study IV, FIG. 8 shows the SSoS of all coils and shots for the first six b values. The results from the 6th slice are shown. From Table 1, HICU is over 5 times faster than SENSE-based IRLS MUSSELS with conjugate symmetry.

DISCUSSION

HICU provides a fast and memory-efficient computational procedure for structured low-rank matrix completion. Using 2D brain images, Study I suggests, from Table 1 and FIG. 3, that HICU can provide over an order of magnitude speedup compared to SAKE and LORAKS while providing comparable image quality across all metrics and significantly reduced memory requirement. Likewise, FIG. 5 shows qualitatively very similar converged reconstruction results for SAKE, LORAKS, and HICU; the similarity is expected in that all three methods exploit the rank deficiency of the Hankel data matrix. The annihilating kernel support used in Study I was rectangular to conform with SAKE implementation (32); however, LORAKS and HICU can support circumscribing circular or spherical kernel masks that have been observed to yield SER gains. NLINV produced much lower image quality in this application than the other methods and required 1.5 to 4 times more computation time than HICU.

From FIG. 3, SAKE and HICU exhibit a decline in SER as iterations proceed past the point of maximum SER. This has been previously observed and may be attributed to the high SER central k-space region used in the CO strategy. High SER of the nullspace can lead to noise amplification in the recovered k-space; this seemingly paradoxical effect has been studied for GRAPPA. The presence of a time dimension in the 2D+t images of Study II ameliorates this behavior.

FIG. 4 explores the choice of JL dimension, p, for the datasets in Study I. The effects of p on both the computation cost per iteration and the SER benefit per iteration combine to yield very similar performance across the range $0.5N_c \le p \le 2N_c$. Note that even when p=1, HICU still manages to reconstruct. This implies that randomness through JL projection can efficiently capture most of the information in the large nullspace. The bottom panel in FIG. 4 suggests that the impact of the CO strategy slightly exceeds the impact of JL on computing time, and that the two speedup factors are approximately multiplicative when the two numerical strategies are adopted jointly.

Figure 6:
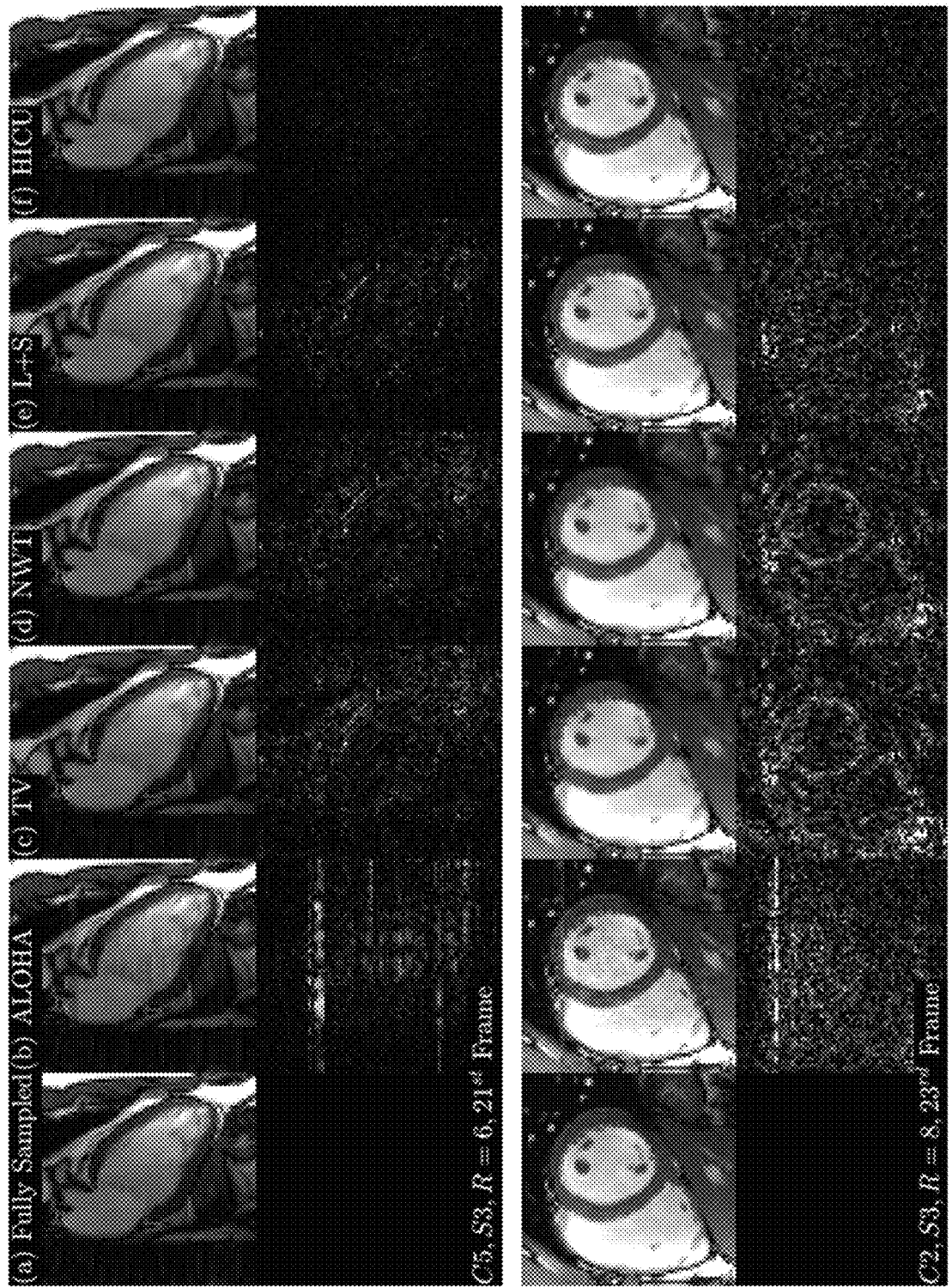
FIG. 6 illustrates the reconstruction results of all methods for the 21st frame of (C5, S3, R=6) and 23rd frame of (C2, S3, R=8), where the first and third rows are an SSoS image, and where the second and fourth rows are 5.34× absolute error.

For 2D+t images in Study II, FIGS. 2 and 6 show that HICU can provide consistently better SER than SENSE-based methods. The SER gain may be attributed to a low-rank model better capturing the multi-coil structure than do the sensitivity maps extracted from the time-averaged ACS region. The average computing times in Study II of the fastest SENSE-based method, NWT, and HICU are 78.5 s and 350.5 s. Yet, to achieve only the same average SER of the best SENSE-based method, L+S, HICU can compute in 77.7 s using only I=16 iterations. ALOHA reconstructions averaged 4.1 dB less SER and required over 13 times longer computation than HICU. The ALOHA reconstruction in FIG. 6 shows banding artifacts, whereas others do not; this difference may be attributed to the slice by slice processing in ALOHA.

Figure 9:
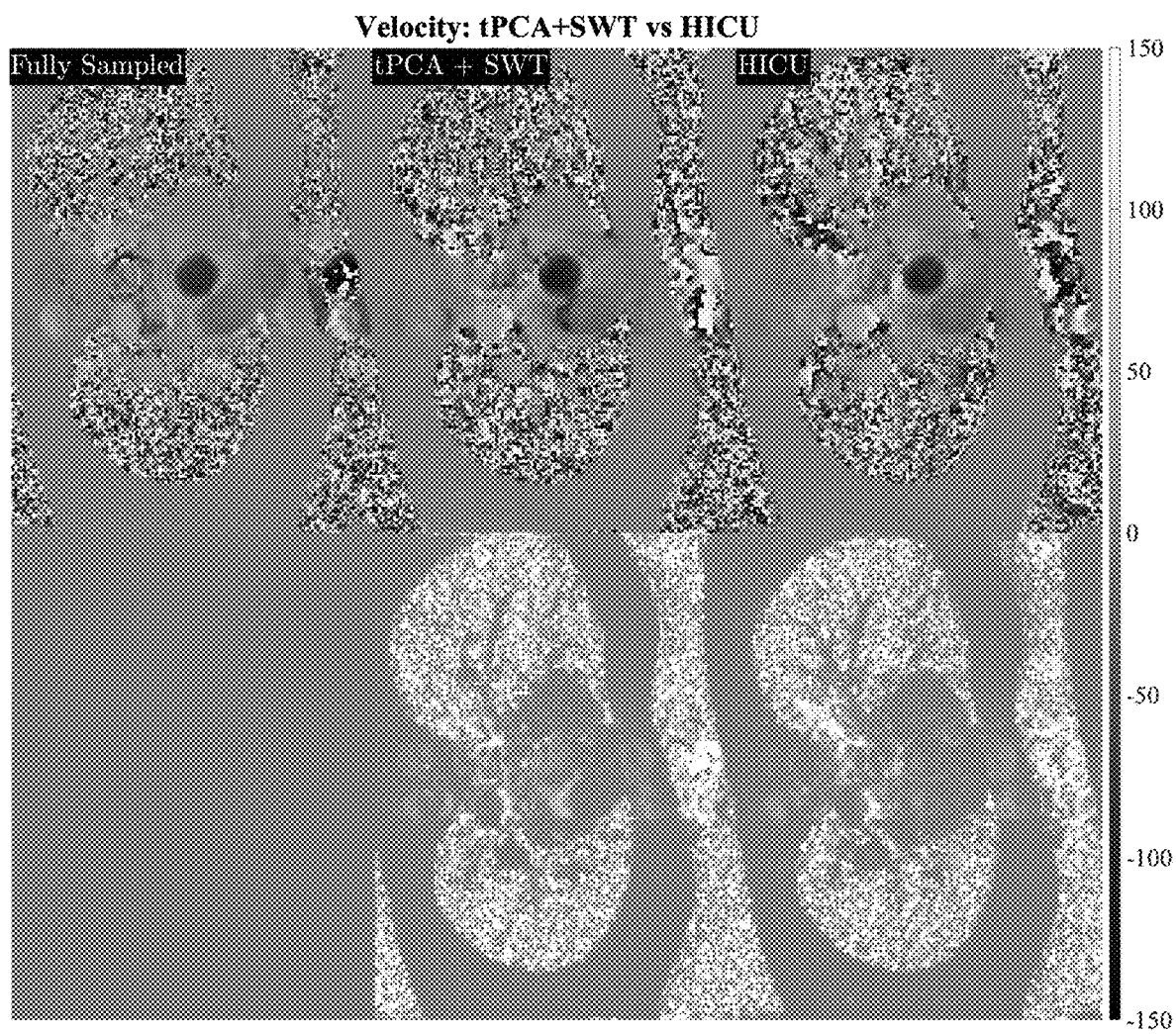
FIG. 9 illustrates 2D Flow. Shown is one dataset, variable sampling pattern, acceleration rate R=7. The reconstructed velocity for the 5th frame. First row: velocity map. Second row: absolute error, tPCA+SWT: 15.20 dB (2 min), HICU: 17.09 dB (1.5 min)

For 3D knee images in Study III, FIGS. 2 and 7 show that HICU can provide, on average, 0.68 dB improvement in SER and 23% less computation time than the SENSE-based methods reported. Thus, in both Study II and the volumetric imaging application in Study III, HICU matrix completion enables calibrationless imaging to exceed SENSE-based CS imaging in both SER and computing speed. In Study IV, HICU is demonstrated for multi-shot diffusion weighted imaging on a large k-space array of 74.7 million samples. FIG. 8 demonstrates qualitatively similar results to IRLS MUSSELS, with five times shorter computation time. FIG. 9 illustrates application to 2D flow imaging. Shown is one dataset, with variable sampling pattern and acceleration rate R=7. The reconstructed velocity is shown for the fifth frame. The velocity map is shown in the first row, and the second row shows absolute error. The SER and reconstruction time for HICU are 17.09 dB and 1.5 minutes, respectively. For the tPCA-SWT algorithm, the SER and reconstruction time are 15.20 and 2 minutes, respectively. Thus, HICU provides both improved image quality and faster computation, compared to tPCA-SWT.

The optimization task addressed by HICU is found in LORAKS and is similar to many other calibrationless parallel imaging approaches. Consequently, the numerical techniques (rSVD, JL, CO) employed in HICU could likewise accelerate algorithms used to optimize other variations of cost functions. For example, for the case of (S1, R=3) in Study I, the use of rSVD (with projection dimension $3r$) reduces average computation time, $T_c$, for SAKE from 239.1±71.7 s to 111.9±32.7 s, without any performance loss. Moreover, various forms of regularization may be used as the functions $f_i(x)$ found in [2] but are not considered in the results presented here. For example, in addition to a soft data consistency function, the $\ell_1$ norm of a linear sparsifying transform of X results in a simple soft-thresholding after Step 8 of Algorithm 1. Similarly, a learned plug-in denoiser could be employed. In either case, this additional regularizer operates on the premise that multi-coil image structure not captured by the low-rank linear dependence assumption can be exploited via a nonlinear denoising step. For the least-squares subproblem, gradient descent with ELS is observed faster than LSQR and conjugate gradient descent in our sparse and rectangular linear system.

Although they attempt to optimize different cost functions, HICU and GIRAF algorithmically share much in common. Instead of the cost in [1], GIRAF seeks to minimize the smoothed Schatten-q quasi-norm, $$J_G(X) = \Sigma_{k=1}^{n} (\sigma_k^2 \{ \mathcal{H}_\mathbb{K}(\mathbb{X}) \} + \epsilon)^{q/2} \tag{3}$$

In its iterative reweighted least-squares computation, GIRAF uses weighted right singular vectors of H(x) as annihilating kernels; the $k^{th}$ singular vector is weighted by $w_k = (\sigma_k + \epsilon)^{-(1-1/2)/2}$, $0 \leq q \leq 1$. Seen in this framework, HICU uses weights $w_k = 0$ for $k \leq r$ and $w_k = 1$ for $r+1 \leq k \leq n$. GIRAF requires computation of the full set of m singular values at each iteration, whereas HICU only requires the r principal right singular vectors, from which a null space basis is found via Householder reflections. Therefore, HICU can benefit from rSVD versus SVD of the Gram matrix. For Study I, we did not observe appreciable difference in computing time between rSVD and SVD of Gram matrix. However, rSVD was significantly faster than SVD of the Gram matrix for larger applications considered in Studies II, III, and IV. For example, for Study II, when rSVD was replaced with SVD of Gram matrix, the average computation time increased by 52%.

The current implementation of HICU has several limitations. HICU requires, like related Cl— MRI algorithms, several tuning parameters, including: rank, kernel support, size of the central region in CO, and the number of iterations or, equivalently, a stopping criterion. An automated selection of these parameters, especially r, is a direction for future work.

Thus, as described above, a variety of physical features contribute to the approximate linear dependence among neighboring k-space samples. This dependence has been leveraged to yield many existing algorithms to recover unobserved k-space samples. We build on this rich literature to present a computational approach, HICU, that is simple, fast, memory efficient, and directly extensible to imaging in higher dimensions. For structured low-rank matrix completion, HICU iteratively estimates unknown annihilating kernels and k-space samples to minimize the tail sum of squared singular values. Computational speed is achieved by random projection, at each iteration, of the annihilating kernel space to a lower-dimensional subspace and employing a small, high-SER center of k-space to quickly build initial estimates of nullspace vectors. Results from 2D brain imaging show that HICU can offer over an order of magnitude speedup compared to existing algorithms. Results from 2D+t and 3D imaging show that HICU can make calibrationless imaging computationally comparable to SENSE-based CS methods while providing improved reconstruction SER. Results from 2D, 2D+t, 3D, and MSDWI demonstrate that HICU can generalize to various MRI applications.

Calibrationless MRI Reconstruction with a Plug-In Denoiser

The following is an extension to the calibrationless MRI reconstructions methods described above. MRI reconstruction from highly under-sampled k-space measurements, $\mathbb{Z}$ often relies on assumptions such as sparsity of image content, smoothness of coil sensitivity map, and additive noise, etc. In a Bayesian framework, assumptions are expressed as priors, and the maximum a posteriori (MAP) estimation of an image, $\mathbb{X}$, and full k-space, $\mathbb{Y}$, from measurements, $\mathbb{Z}$, is:

$$\max_{\mathbb{X},\mathbb{Y}} \log P(\mathbb{X}, \mathbb{Y}, \mathbb{Z}) \Leftrightarrow \max_{\mathbb{X},\mathbb{Y}} \log P(\mathbb{Z} \mid \mathbb{X}, \mathbb{Y}) P(\mathbb{Y} \mid \mathbb{X}) P(\mathbb{X}) \Leftrightarrow$$

$$\min_{\mathbb{X},\mathbb{Y}} -\log P(\mathbb{Z} \mid \mathbb{X}, \mathbb{Y}) - \log P(\mathbb{Y} \mid \mathbb{X}) - \log P(\mathbb{X})$$

For a regularized SENSE-based method, the coil sensitivity map is taken as known, and $\mathbb{Z} \longmapsto \mathbb{Y}$ is a deterministic injection. The general optimization formulation of regularized SENSE is $$\min_{\mathbb{X}} \mathcal{D}(\mathcal{A}(\mathbb{X}), \mathbb{Z}) + \lambda \mathcal{C}(\mathbb{X}) \tag{4}$$

where $\mathcal{D}$ denotes a data fitting metric and $\mathcal{A}(X) = \mathbb{M} \circ \mathcal{F} \circ \mathbb{S} \circ \mathbb{X}$) denotes composition of coil sensitivity $\mathbb{S}$, Fourier transform $\mathcal{F}$ and down-sampling $\mathbb{M}$. Here, denotes Hadamard product and $\lambda$ is Lagrange multiplier; $\lambda \mathcal{C}(\mathbb{X}) + c_1$ is the negative logarithm of the image content prior, where $c_1$ is a constant. Common choices of $\mathcal{D}$ include square of Frobenius norm $\mathcal{D}(\mathcal{A}(\mathbb{X}), \mathbb{Z}) = |\mathcal{A}(X) - Z|_F^2$, which corresponds to a Gaussian noise distribution for $\mathbb{Z} \mid \mathcal{A}(\mathbb{X})$, or an indicator function to enforce exact data consistency $$\mathcal{D}(\mathcal{A}(\mathbb{X}), \mathbb{Z}) = \begin{cases} 0, & \mathcal{A}(\mathbb{X}) = \mathbb{Z} \\ \infty, & \text{else.} \end{cases}$$

For compressed sensing methods, typically $\mathcal{C}(\mathbb{X}) = |\mathcal{B}(\mathbb{X})|_1$, where $\mathcal{B}$ is a sparsifying transform and $|\cdot|$ is summation of absolute values of all elements. In this case, $-\log P(\mathbb{X}) = \lambda \mathcal{C}(\mathbb{X}) + c_1 = \lambda |\mathcal{B}(\mathbb{X})|_1 + c_1$, and the penalty term corresponds to a Laplace distribution on $\mathcal{B}(\mathbb{X})$. Regularized GRAPPA-based methods recover the full k-space $\mathbb{Y}$ from measurement $\mathbb{Z}$, then combine coils to map $\mathbb{Y}$ to $\mathbb{X}$. Since the coil sensitivity map is element-wise applied to each voxel through multiplication, each coil image is a modulated version of $\mathbb{X}$ and inherits a prior related to the prior on $\mathbb{X}$. For example, if $\mathbb{X}$ is K-sparse, then each coil image is at most K-sparse. The general optimization formulation of a regularized GRAPPA-based method is $$\min_{\mathbb{Y}} \mathcal{D}(\mathbb{M} \circ \mathbb{Y}, \mathbb{Z}) + \lambda \mathcal{L}(\mathbb{Y}\mathbb{Y}) \tag{5}$$

where $\lambda$ is the Lagrange multiplier, $\lambda \mathcal{L}$ (y) is the negative logarithm of the prior on the k-space, or equivalently on the coil images. Many physical assumptions encoded into $\mathcal{L}$ (Y), such as coil sensitivity smoothness or limited image support, result in a linear dependence among neighborhoods of k-space points, which in turn is equivalent to an approximate rank-deficiency of a convolution matrix $\mathcal{H}_\mathbb{K}(\mathbb{Y})$ built from the k-space samples, where $\mathbb{K}$ denotes the neighborhood in multi-coil k-space. Let $\sigma(\mathcal{H}_\mathbb{K}(\mathbb{Y}))=[\sigma_1, \ldots, \sigma_n]$ denote the singular values of the convolution matrix, in non-increasing order. The squared Euclidean distance of $\mathcal{H}_\mathbb{K}$ (Y) from the closed set of matrices with rank r or less is $\Sigma_{i>r}\sigma_i^2$, and adopting $\mathcal{L}(\mathbb{Y})=\Sigma_{i>r}\sigma_i^2$ corresponds to modeling the tail singular values as distributed according to a rectified Gaussian prior.

This extension considers the problem formulation in (5) with $\mathcal{D}$ (·) chosen to enforce data consistency. Additionally, we assume $\mathcal{L}(\mathbb{Y})$ of the form $\Sigma_{i>r}\sigma_i^2 + \varepsilon(Y)$, where $\varepsilon(\mathbb{Y})$ denotes signal modeling that cannot be captured via only the rank deficiency of $\mathcal{H}_\mathbb{K}(\mathbb{Y})$. The optimization problem can be organized as:

$$\arg\min_{\mathbb{Y}} \sum_{i>r} \sigma_i(\mathcal{H}_\mathbb{K}(\mathbb{Y}))^2 + \varepsilon(\mathbb{Y}) \text{ s.t. } \mathbb{M} \circ \mathbb{Y} = \quad (6)$$

$$\mathbb{Z} \Leftrightarrow \arg\min_{\mathbb{Y},Q} |\mathcal{H}_\mathbb{K}(\mathbb{Y})Q|_F^2 + \varepsilon(\mathbb{Y})$$

$$s.t. \ \mathbb{M} \circ \mathbb{Y} = \mathbb{Z}, \ Q'Q = I$$

where $\mathcal{H}_\mathbb{K}(\mathbb{Y}) \in \mathbb{C}^{m \times n}$ and $Q \in \mathbb{C}^{n \times (n-r)}$ The cost formulation (6) suggests an alternating minimization algorithm, which alternatively updates Q and $\mathbb{Y}$. For a given $\mathbb{Y}$, Q is the matrix of singular vectors corresponding to the tail singular values. For a given Q, updating $\mathbb{Y}$ is a regularized least squares problem. One method for this regularized least-squares sub-problem is proximal gradient descent, where for a function $\mathcal{F}(\mathbb{Y})$ its proximal operator is $$prox_\mathcal{F}(\mathbb{Y}) = \arg\min_\mathbb{X} \frac{1}{2}|\mathbb{X} - \mathbb{Y}|_F^2 + \mathcal{F}(\mathbb{X}).$$

Proximal gradient descent for updating $\mathbb{Y}$ given $Q^{(k)}$ is $\mathbb{Y}^{(k+1)} = prox_{\eta_k \varepsilon}(\mathbb{Y}^{(k)} = -\eta_k \nabla_\mathbb{Y} \mathcal{H}_\mathbb{K}(Y)Q^{(k)}|_F^2|_{\mathbb{Y}=\mathbb{Y}^{(k)}})$ where $\eta_k$ is the step size for the kth iteration. Moreover, the proximal operator $prox_{\eta_k \varepsilon}(\cdot)$ can be considered as an additive Gaussian denoising operator.

In this work, we use plug-in denoisers $\mathcal{V}$ (·) to replace the proximal operator, and we pair $\mathcal{V}$ (·) with our Highdimensional Fast Convolutional Framework (HICU) to improve the reconstruction quality.

Methods

HICU employs the prior of linear dependency in k-space and leverages the efficiency of randomized numerical methods. The cost function in (6) is optimized using three numerical techniques: randomized singular value decomposition (rSVD), center-out strategy (CO), and randomized mixing of null space basis vectors inspired by Johnson Lindenstrauss lemma (JL). The CO strategy invokes shift invariance of the linear prediction property to operate on a small, low-noise, center portion of k-space at early iterations. Taken together, the numerical strategies yield both fast computation and low memory requirement. In this work, we use a denoiser $\mathcal{V}$ (·) to utilize additional modeling assumptions corresponding to $\varepsilon(Y)$. Specifically, we consider two: soft thresholding in a stationary wavelet transform domain (SWT), and a trained deep neural network (DNN) denoiser. The pairing of HICU with a denoiser is given in Algorithm 1A, below.

ALGORITHM 1A

Require: Zero-filled observed k-space, $\mathbb{Z}$; Sampling mask,
$\mathbb{M}$; Kernel mask, $\mathbb{K}$; Region of k-space, $\mathbb{R}^{(0)}$; Rank, r;
Compression dimension, p; Number of iterations, I; Denoiser, $\mathcal{V}(\cdot)$; Initialize $\mathbb{Y}^{(0)} = \mathbb{Z}$
1: for i = 1 to I do
2:   Compute $V^{(i)}$, the r principal right singular vectors of $\mathcal{H}_\mathbb{K}^{(i)}(\mathbb{Y}^{(i-1)})$ via rSVD    rSVD
3:   Compute orthonormal basis. $Q^{(i)} \perp V^{(i)}$ via r Householder reflections
4:   Select region, $\mathbb{R}^{(i)}$, on which to compute valid convolution using $\mathcal{H}_\mathbb{K}^{(i)}(\mathbb{Y}^{(i-1)})$    CO
5:   Prepare for $G_i$ descent steps, $\mathbb{W}^{(0)} = \mathbb{Y}^{(i-1)}$
6:   for j = 1 to $G_i$ do
7:     Compress nullspace to p dimensions, $\tilde{Q}^{(i,j)} = Q^{(i)} P^{(i,j)}$, where $P^{(i,j)}$ is i.i.d. normal    JL
8:     Calculate the gradient, $G^{(j)} = \nabla_W |\mathcal{H}_\mathbb{K}^{(i)}(\mathbb{W}^{(j-1)})Q^{(i,j)}|_F^2$, $G^{(j)} = G^{(j)} \circ \mathbb{M}$
9:     Update with step-size set by exact line search, $\mathbb{W}^{(j)} = \mathbb{W}^{(j-1)} - \eta^{(j)} G^{(j)}$
10:    Denoise $\mathbb{W}^{(j)} = \mathcal{V}(\mathbb{W}^{(j)})$    Denoising
11:    Enforce data consistency $\mathbb{W}^{(j)} = \mathbb{W}^{(j)} \circ \bar{\mathbb{M}}$
12:  end for
13:  Save result of gradient steps, $\mathbb{Y}^{(i)} = \mathbb{W}^{(G_i)}$
14: end for
Ensure: Reconstructed k-space, $\mathbb{Y}^{(I)}$ Experiments and Results We compare three algorithm choices: HICU, HICU paired with SWT (HICU+SWT), and HICU paired with DNN denoiser (HICU+DNN). We use 119 T2 weighted brain datasets E1 to E119 from fastMRI to benchmark the reconstruction. All datasets were fully sampled and collected in an axial orientation on 3 T scanners using a T2-weighted turbo spin-echo sequence. Other imaging parameters included: TE 113 ms, TR 6,000-6,570 ms, TI 100 ms, field-of-view (FOV) 220 mm×227 mm, slice thickness 7.5 mm, matrix size 384×384, number of receive coils 16-20, and flip angle 149-180 degrees. The center slice from each dataset was used. The sampling patterns and acceleration rates are shown in FIG. 1. For all three algorithm choices, rank r=30, which is chosen based on one additional dataset for sampling pattern S7; R=5. The filter kernel size is 3×3× $N_c$, where $N_c$ is the number of coils; valid convolution is computed without the need for data padding. CO processing is organized simply as two stages. The first uses the center ¼$N_x$×¼$N_y$×$N_c$ portion of k-space, p=8, and iteration count Gi=5 (Step 6). The second stage uses the full k-space, p=32, and iteration count Gi=10. The number of outer iterations (I in Step 1) dedicated to the first CO stage was tuned based on the same additional dataset to achieve fast convergence and was held constant for all six combinations of sampling patterns and acceleration rates. Computation in all cases was terminated at one minute. For computational speed, both HICU+SWT and HICU+DNN only apply the denoiser (Step 10) in the second CO stage.

For HICU+SWT, the threshold for SWT was tuned based on the additional dataset. The threshold is proportional to the step size obtained in the exact line search (Step 9). For HICU+DNN, the DNN denoiser was trained on additional 300 T2 weighted brain datasets with 15 dB additive simulated Gaussian noise. DNN network $N(\cdot)$ takes a noisy image as the input and yields the estimated noise as the output. Thus, $V(\cdot)=I(\cdot)-N(\cdot)$, where $I(\cdot)$ denotes the identity map. The architecture of N consists of five convolution layers with ReLU function, followed by a sixth convolution layer. The numbers of channels from the first to the sixth convolution layer are 256; 256; 128; 128; 128; 2. Reconstruction quality is reported in terms of SER, which is defined as $20 \log_{10}(|\hat{\Psi} - \Psi|_F/|\Psi|_F)$.

For all studies, processing was performed in Matlab 2020a (Mathworks, Natick, Mass., US) on an Alienware Aurora Ryzen™ desktop, equipped with an AMD Ryzen 3950X CPU and 64 GB memory and Nvidia RTX 2080 Ti.

Figure 10:
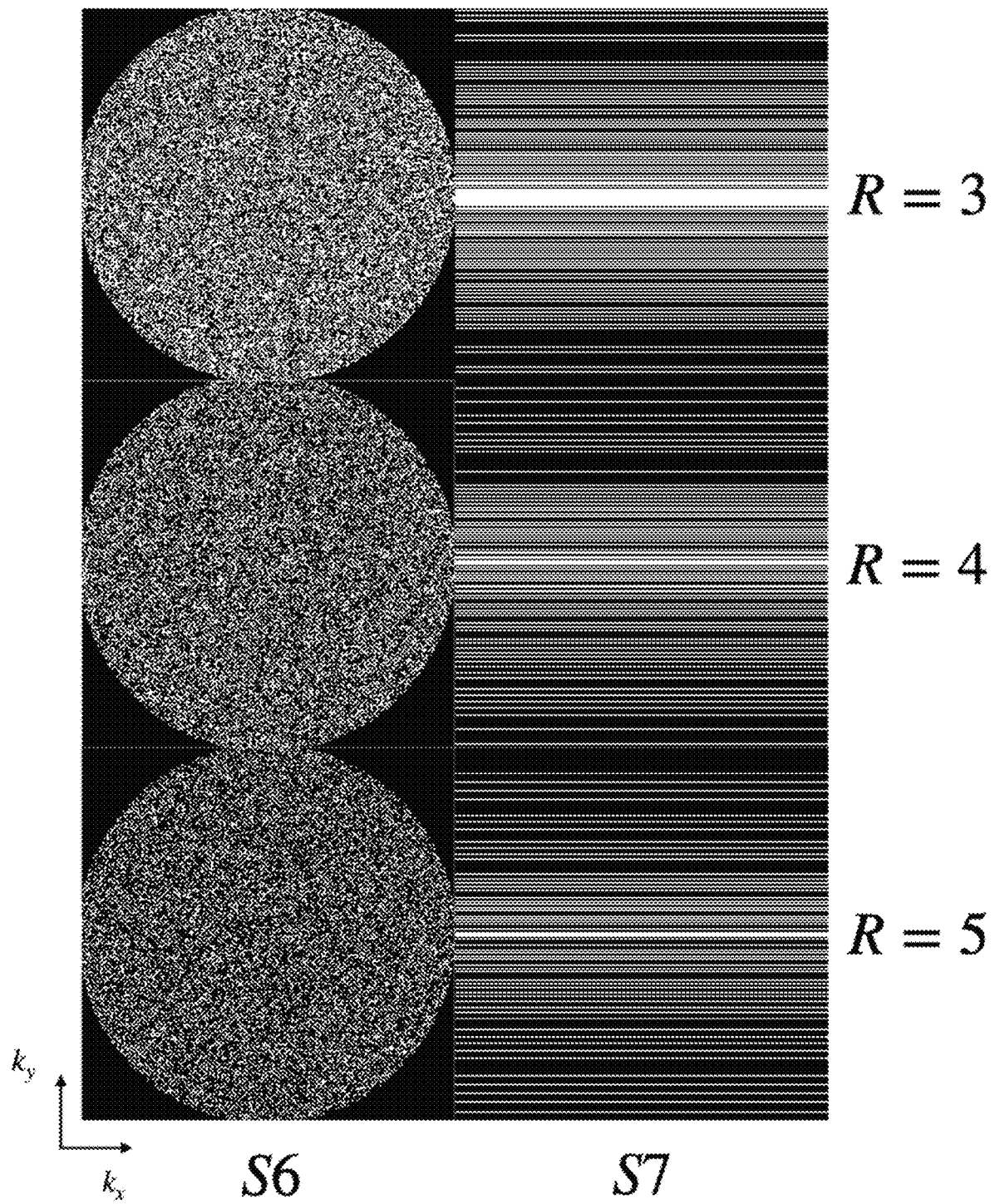
FIG. 10 shows the two sampling patterns (2D random down sampling S6 and 1D variable density down sampling S7) at three acceleration rates R=3, 4, 5.

FIG. 10 shows the two sampling patterns (2D random downsampling S6 and 1D variable density downsampling S7) at three acceleration rates R=3; 4; 5.

Figure 11:
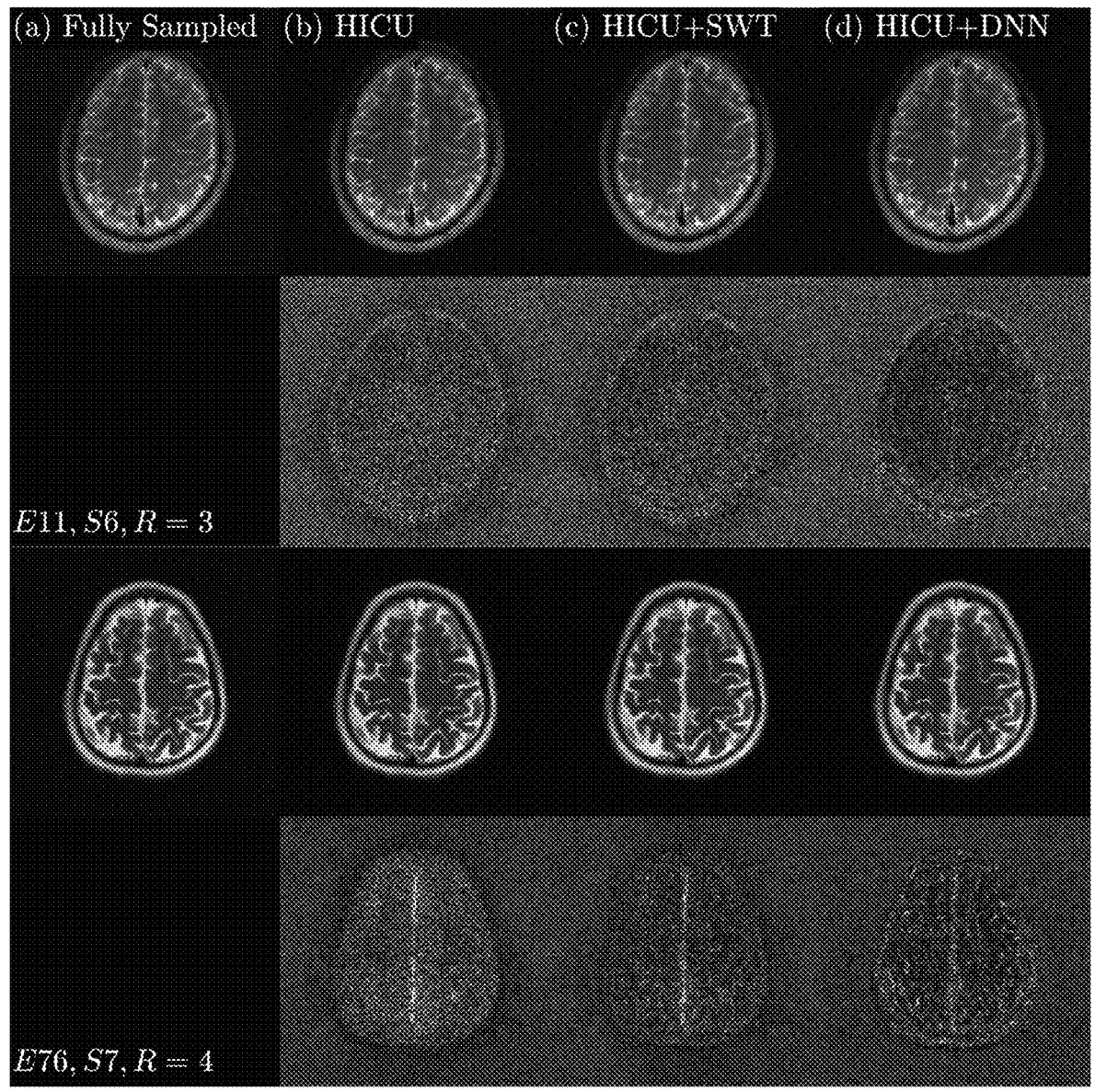
FIG. 11 shows representative reconstructed images for D11, S6, R=3, and D76, S7, R=4.

FIG. 11 shows representative reconstructed images for E11, S1, R=3, and E76, S2, R=4; these examples are chosen such that the difference between SER for HICU+DNN and HICU+SWT is closest to the average SER difference for each sampling pattern and acceleration.

Figure 12:
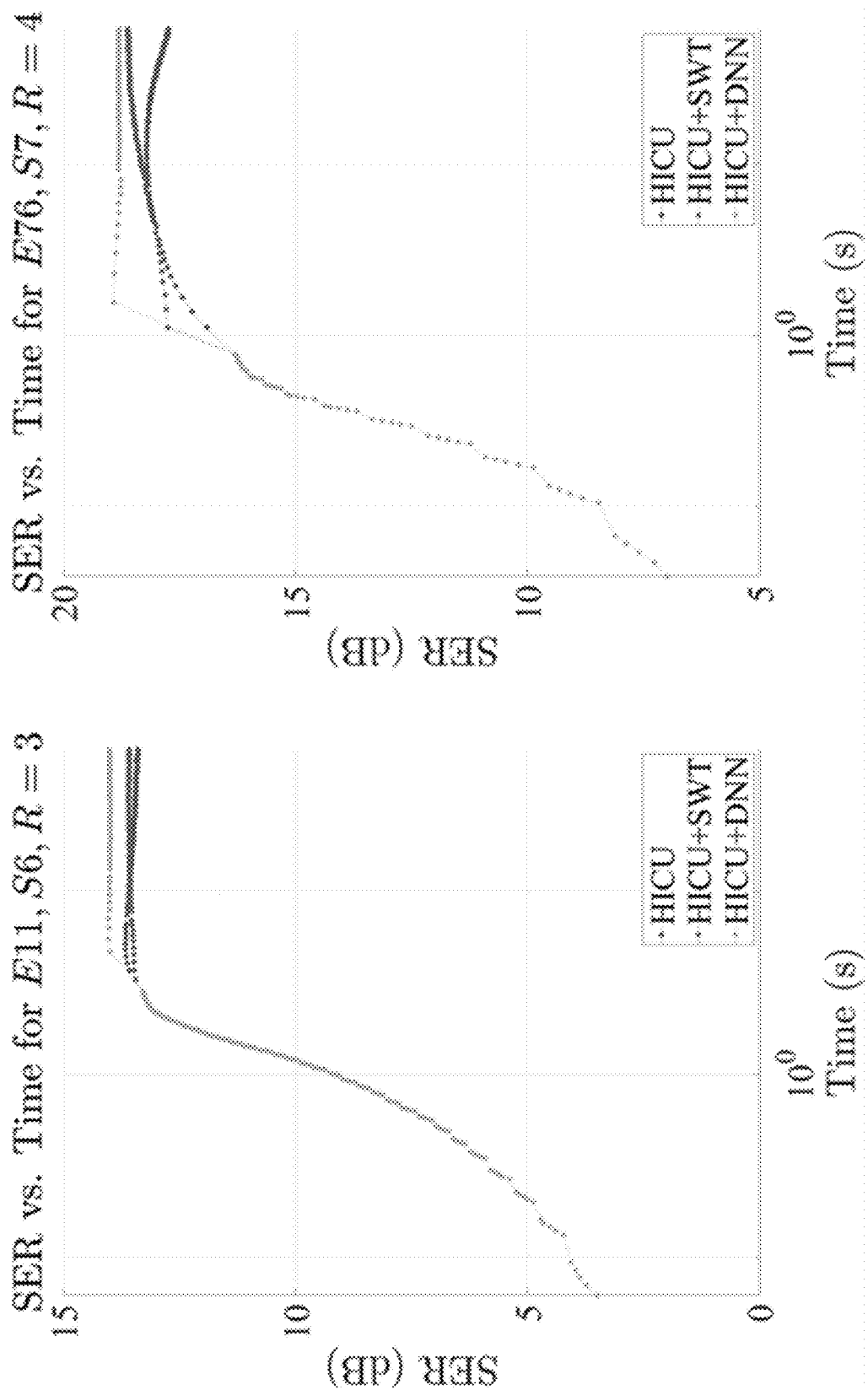
FIG. 12 shows the SER versus log of compute time for D11, S6, R=3 and D76, S7, R=4.

FIG. 12 shows the reconstruction SER versus log of compute time for E11, S1, R=3 and E76, S2, R=4. The use of SWT and DNN denoisers both improves peak SER and greatly ameliorates the decay of SER seen in HICU as iterations continue past peak SER. We conjecture that reduced SER decay for HICU+DNN, as seen in FIG. 12, makes the performance more robust to a stopping criterion. Although applying the plug-in denoiser requires higher floating-point operations per iteration, it provides greater SER improvement per iteration. The net effect is that HICU+DNN achieves higher reconstruction SER in less time than without the machine learning prior. For example, for (S7, R=4), HICU needs on average 11.06 seconds to reach peak SER; however, HICU+DNN only needs on average 6.49 seconds to reach the peak SER of HICU.

Figure 13:
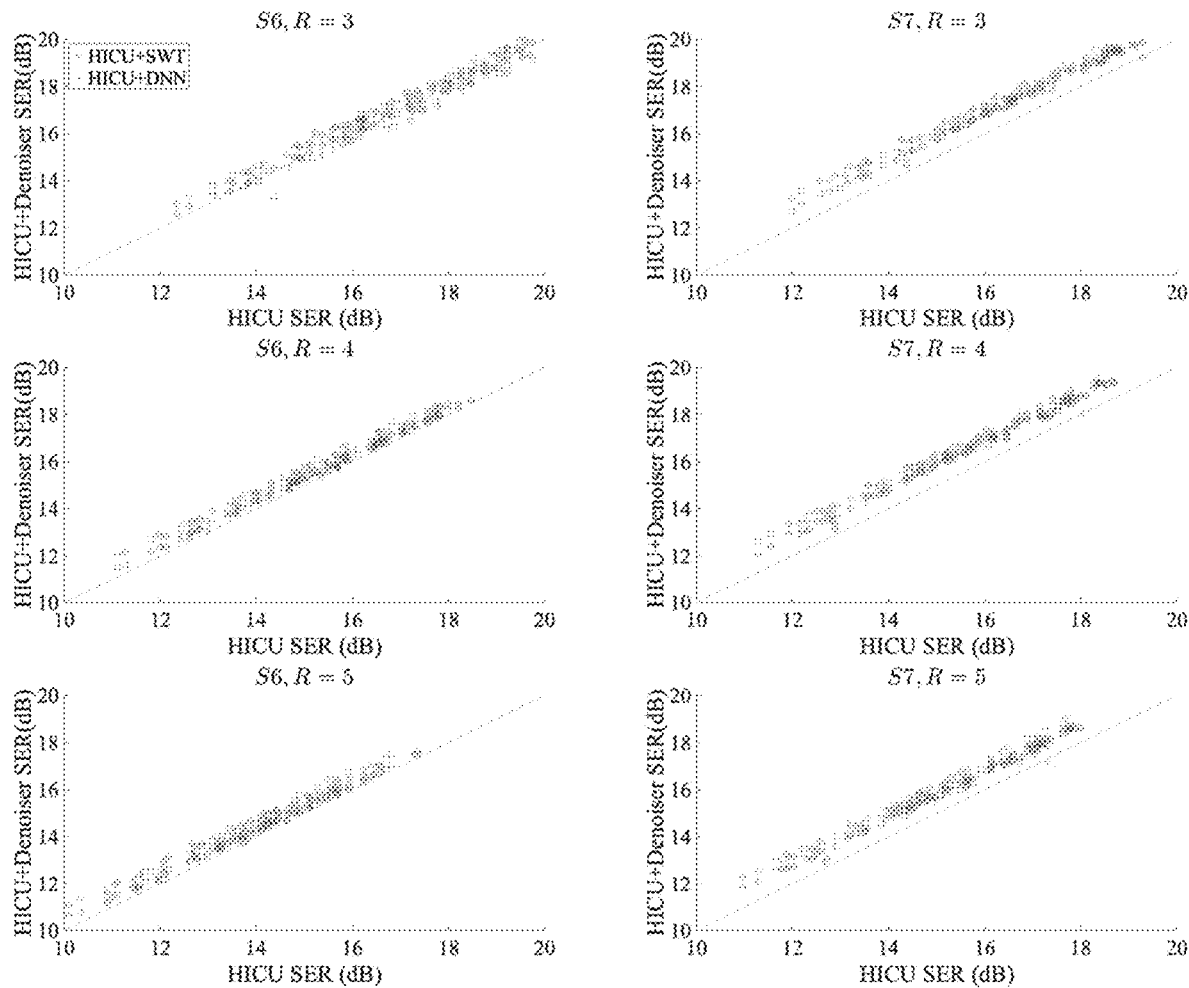
FIG. 13 shows, for each of the six combinations of sampling pattern and acceleration rate, the SER of HICU+ SWT and HICU+DNN compared with HICU as a scatter plot of all 119 data sets.

FIG. 13 shows, for each of the six combinations of sampling pattern and acceleration rate, the reconstruction SER of HICU+SWT and HICU+DNN compared with HICU as a scatter plot of all 119 data sets. For all sampling patterns and acceleration rates, HICU+DNN yields consistently higher SER than HICU without the plug-in denoiser, as seen by the cluster of red data points above the 45-degree line. The average SER of HICU+DNN over HICU for (S6, R=3), (S6, R=4), . . . to (S7, R=5) are 0.39, 0.55, 0.62, 1.02, 1.05, 1.00 dB in FIG. 12. Moreover, DNN consistently outperforms SWT as a denoiser. For (S6, R=3), HICU+SWT produces SER similar to or even lower than HICU, this is partially due to differences between (S6, R=3) and (S7, R=5), which was used to tune the wavelet thresholding parameter. In addition, the DNN denoiser trained at 15 dB can perform decently across different datasets and sampling patterns, for which the reconstruction SER of HICU ranges from 10 dB to 20 dB.

DISCUSSION

The use of a plug-in denoiser enables HICU, a fast calibrationless accelerated imaging method, to leverage an implicit machine learning prior not captured by the linear dependency image model. The denoiser is observed to improve the reconstruction quality as measured by reconstruction SER and suppresses SER degradation observed in HICU, additionally, despite the increase in computation per iteration, the denoiser reduces net computation time.

EXAMPLE ENVIRONMENT

Figure 14:
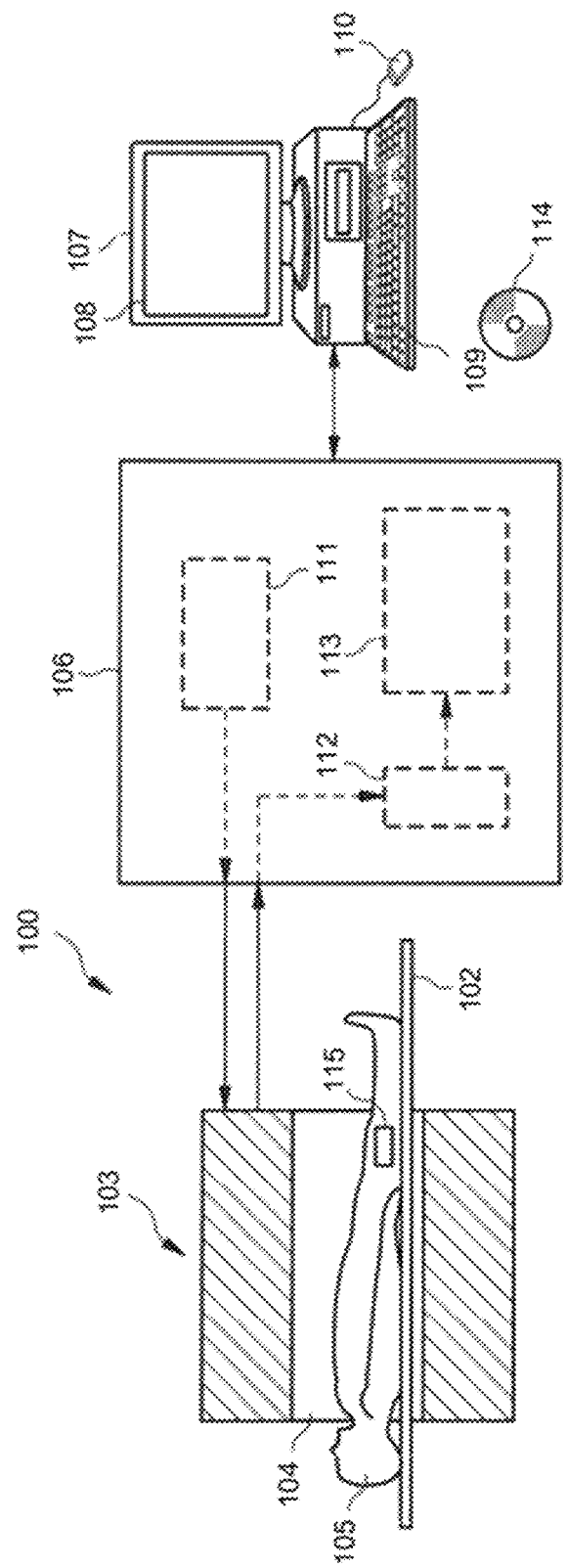
FIG. 14 is a view illustrating a structure of an example magnetic resonance imaging (MRI) apparatus that may be used to acquire image data.

FIG. 14 is a view illustrating a structure of an example magnetic resonance imaging (MRI) apparatus 100 that may be used to acquire image data. Generally, the MRI apparatus 100 is a low-field or high-field system equipped with a high-end data processing unit (DPU) to enable the implementation of HICU. The DPU may be comprised external GPU-equipped systems running, e.g., a Gadgetron framework, which was developed at the National Heart, Lung, and Blood Institute.

The MRI apparatus 100 includes a scanner 103 that generates magnetic fields used for the MR examination within a measurement space 104 having a patient table 102. In accordance with the present disclosure, the scanner 103 may include a wide bore 70 cm superconducting magnet having a field strength of approximately 0.35-7.0 Tesla (T).

A controller 106 includes an activation unit 111, a receiver device 112 and an evaluation module 113. During a phase-sensitive flow measurement, MR data are recorded by the receiver device 112, such that MR data are acquired in, e.g., a measurement volume or region 115 that is located inside the body of a patient 105. The MRI apparatus 100 may include an 18-coil array (e.g., arranged as two 3×3 grids), support uniform, random or pseudo-random sampling patterns, compressed-sensing based reconstruction methods, and perform analog-to-digital conversion (ADC) at a gantry of the MRI apparatus 100.

An evaluation module 113 prepares the MR data such that they can be graphically presented on a monitor 108 of a computing device 107 and such that images can be displayed. In addition to the graphical presentation of the MR data, a three-dimensional volume segment to be measured can be identified by a user using the computing device 107. The computing device may include a keyboard 109 and a mouse 110. The computing device may include a Ryzen central processing unit (CPU) or better, 64 GB of random access memory (RAM) or higher, Multi-GPU, GEFORCE RTX 2080 Ti reconstruction hardware, support DiCOM 3.0, and support simultaneous scan and reconstruction.

Software for the controller 106 may be loaded into the controller 106 using the computing device 107. Such software may implement a method(s) to process data acquired by the MRI apparatus 100, as described below. It is also possible the computing device 107 to operate such software. Yet further, the software implementing the method(s) of the disclosure may be distributed on removable media 114 so that the software can be read from the removable media 14 by the computing device 107 and be copied either into the controller 106 or operated on the computing device 107 itself.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for Magnetic Resonance Imaging (MRI) reconstruction comprising:
   acquiring undersampled k-space MRI data;
   interpolating and extrapolating the undersampled k-space MRI data to form a completed k-space data array;
   computing, by convergent iteration, the completed data array to minimize a cost function defined as the weighted distance of a multi-level block Hankel matrix to a manifold of matrices with a rank, r, that is an integer value associated with a cost function;
   converting the completed data array into reconstructed images; and
   displaying the reconstructed images.

2. The method in claim 1, wherein, at each iteration, an element in the linear variety of multi-level block Hankel matrices is parsimoniously parametrized and updated using the k-space data array and the principal r right singular vectors from the previous iterate, without recourse to the full tangent space to the low-rank manifold.

3. The method in claim 2 where the cost function is augmented by one or more functionals differentiable with respect to the entries in the data array; examples include barrier function for exact match of observed k-space samples and a weighted norm of mismatch between estimated and observed k-space samples.

4. The method in claim 2 where an image or k-space denoising subroutine is called within each iteration.

5. The method in claim 2, wherein computation of a descent direction on the variety is accelerated by reducing the dimensionality of the multi-level Hankel matrix nullspace from r to p, constructed either explicitly or implicitly for the purpose of computing a descent direction.

6. The method in claim 2, wherein the time to convergence is accelerated by interpolating a small subregion of the data array, then progressively expanding the region to encompass the entirety of the data array.

7. The method in claim 2, wherein k-space data array has dimensions beyond spatial frequency, including time, coil, diffusion encoding, and velocity encoding.

8. The method in claim 2, wherein update of multi-level Hankel matrix nullspace is stopped, while continuing descent iterations to update the data array.

9. The method in claim 2, wherein additional nullspace vectors are approximated at initialization by collapsing one dimension of the completed data array via averaging.

10. The method in claim 2, wherein the kernel size used to construct the multi-level Hankel matrix has, in any dimension, any integer size no less than 1 and no greater than the size of the data array in the corresponding dimension.

11. The method of claim 2, wherein the kernel size used to define the multi-level Hankel matrix is modified from iteration to iteration.

12. The method of claim 5, wherein the dimension, p, of the reduced-dimension nullspace is modified from iteration to iteration.

13. The method of claim 2, wherein the coil dimension of the data array is compressed to a smaller dimension or expanded using virtual coils via conjugate symmetry.

14. The method in claim 2, wherein the procedure is applied independently and in parallel to planes of dimension N-1 extracted from the N-dimensional data array.

15. The method of claim 2, wherein initial iterations for a data array of dimension N are accelerated by operating on (N-q)-dimensional planes of the data array for $1<q<N$.

16. A non-transitory computer-readable storage medium storing instructions that when executed by a computer cause the computer to perform a method for Magnetic Resonance Imaging (MRI) reconstruction, comprising:
   acquiring undersampled k-space MRI data;
   interpolating and extrapolating the undersampled k-space MRI data to form a completed k-space data array;
   computing, by convergent iteration, the completed data array to minimize a cost function defined as the weighted distance of a multi-level block Hankel matrix to a manifold of matrices with a rank, r, that is an integer value associated with a cost function:
   converting the completed data array into reconstructed images; and
   displaying the reconstructed images.

17. The non-transitory computer-readable storage medium as recited in claim 16, further comprising instructions wherein, at each iteration, an element in the linear variety of multi-level block Hankel matrices is parsimoniously parametrized and updated using the k-space data array and the principal r right singular vectors from the previous iterate, without recourse to the full tangent space to the low-rank manifold.

18. The non-transitory computer-readable storage medium as recited in claim 17, further comprising instructions wherein the cost function is augmented by one or more functionals differentiable with respect to the entries in the data array; examples include barrier function for exact match of observed k-space samples and a weighted norm of mismatch between estimated and observed k-space samples.

19. The non-transitory computer-readable storage medium as recited in claim 17, further comprising instructions wherein computation of a descent direction on the variety is accelerated by reducing the dimensionality of the multi-level Hankel matrix nullspace from r to p, constructed either explicitly or implicitly for the purpose of computing a descent direction.

20. The non-transitory computer-readable storage medium as recited in claim 17, further comprising instructions wherein the time to convergence is accelerated by interpolating a small subregion of the data array, then progressively expanding the region to encompass the entirety of the data array.

* * * * *